United States Patent

Gogami et al.

[11] Patent Number: 6,076,737
[45] Date of Patent: Jun. 20, 2000

[54] APPARATUS AND METHOD OF MANUFACTURING AN INTEGRATED CIRCUIT (IC) CARD WITH A PROTECTIVE IC MODULE

[75] Inventors: Masao Gogami; Yoshikazu Fukushima, both of Tokyo-To, Japan

[73] Assignee: Dai Nippon Printing Co., Ltd., Japan

[21] Appl. No.: 09/377,921

[22] Filed: Aug. 20, 1999

Related U.S. Application Data

[63] Continuation of application No. 08/750,063, Dec. 3, 1996, Pat. No. 5,975,420.

[30] Foreign Application Priority Data

Apr. 13, 1995 [JP] Japan ..................... 7-111110
Sep. 13, 1995 [JP] Japan ..................... 7-259538

[51] Int. Cl.[7] ............................................. G06K 19/06
[52] U.S. Cl. .......................... 235/492; 235/488; 361/737
[58] Field of Search .................... 235/492, 488, 235/451, 487; 902/26; 361/737

[56] References Cited

U.S. PATENT DOCUMENTS

| | | | |
|---|---|---|---|
| 4,727,246 | 2/1988 | Hara et al. | 235/492 |
| 4,804,528 | 2/1989 | Oogita | 235/1 D |
| 4,804,828 | 2/1989 | Oogita | 235/492 |
| 4,961,105 | 10/1990 | Yamamoto | 357/72 |
| 4,990,759 | 2/1991 | Gloton et al. | 235/492 |
| 5,013,900 | 5/1991 | Hoppe | 235/492 |
| 5,027,190 | 6/1991 | Haghiri-Tehrani et al. | 235/492 |
| 5,031,026 | 7/1991 | Ueda | 235/492 X |
| 5,055,913 | 10/1991 | Haghiri-Tehrani | 235/492 |
| 5,057,679 | 10/1991 | Audic et al. | 235/492 |
| 5,208,450 | 5/1993 | Uenishi et al. | 235/492 |
| 5,264,990 | 11/1993 | Venambre | 235/488 X |
| 5,283,423 | 2/1994 | Venambre et al. | 235/492 |
| 5,428,750 | 6/1995 | Venambre | 235/492 |
| 5,519,201 | 5/1996 | Templeton, Jr. et al. | 235/492 |
| 5,598,032 | 1/1997 | Fidalgo | 235/492 |
| 5,612,532 | 3/1997 | Iwasaki | 235/492 |
| 5,637,858 | 6/1997 | Hoppe et al. | 235/492 |
| 5,682,294 | 10/1997 | Horejs, Jr. et al. | 361/737 |
| 5,975,420 | 11/1999 | Gogami et al. | 235/492 |

FOREIGN PATENT DOCUMENTS

| | | |
|---|---|---|
| 635 801 A2 | 1/1995 | European Pat. Off. |
| 2 702 067 A1 | 9/1994 | France. |
| 62-249796 | 10/1987 | Japan. |
| 2-30598 | 1/1990 | Japan. |
| 4-179595 | 6/1992 | Japan. |
| 5-42791 | 2/1993 | Japan. |
| 5-62031 | 3/1993 | Japan. |

*Primary Examiner*—Michael G Lee
*Attorney, Agent, or Firm*—Parkhurst & Wendel, LLP

[57] ABSTRACT

An IC card (1) has a base card (2), and an IC module (10) placed in a cavity (3) formed in one surface of the base card (2). The IC module (10) comprises a substrate (11), a contact layer (15) formed on one surface of the substrate (11), an IC chip (12) attached to the other surface of the substrate (11), and a frame (14) attached to the other surface of the substrate (11). A space defined by the frame (14) is filled up with an encapsulating resin (13) so as to encapsulate the IC chip (12). A deflection per unit length of the substrate (11) under a predetermined load is greater than that of the base card (2) under the same load. When a bending force is applied to the IC card (1), a portion around the IC chip (12) is protected by the encapsulating resin (13) and the frame (14), and portion of the substrate (11) other than the portion around the IC chip (12) is distorted greatly to absorb the bending force.

8 Claims, 16 Drawing Sheets

APPARATUS AND METHOD OF MANUFACTURING AN INTEGRATED CIRCUIT (IC) CARD WITH A PROTECTIVE IC MODULE

This is a Continuation of application Ser. No. 08/750,063 filed Dec. 3, 1996 now U.S. Pat. No. 5,975,420.

TECHNICAL FIELD

The present invention relates to an IC card and an IC module for forming the IC card and, more specifically, to an IC card with a decreased physical failure rate in the market including those attributable to bending and the like and an IC module for forming the IC card.

BACKGROUND ART

IC cards are expected to be used in various fields owing to their high security. IC cards have attracted considerable attention as new information recording mediums, particularly, as information recording mediums that will replace magnetic cards have come into wide use recently.

Generally, an IC card is fabricated by mounting an IC module of a COB (chip-on-board) configuration on a base card. Information is written to and read from the IC module by bringing the contacts of the IC module into electrical contact with the contacts of a R/W head (read/write head).

The IC module of the IC card has a substrate, and contacts to be connected to CLK (clock) lines, I/O lines, $V_{cc}$ lines (power lines), RST (reset) lines, GND (grounding) lines and such are formed on one surface of the substrate, semiconductor devices included in an IC chip mounted on the other surface of the substrate are connected electrically by wires to the contacts. The IC chip is sealed in an encapsulating resin.

Elements formed opposing surfaces of the substrate are electrically connected via through holes.

The base card of the IC card provided with the IC module is a flexible, thin polyvinyl chloride card body or the like. Therefore, physical failures are caused in the IC module sometimes by the bending of the base card and pressure being directly applied to the IC module.

One of the failures is the cracking of the IC chip. When the IC card is bent or the IC module is exposed directly to a pressure that induces a stress which the IC module is unable to withstand, cracks develop in boundaries between the contacts and the like. Some other physical failures are caused by the disconnection of the wires and the cracking of the resin.

For example, in a conventional IC module, a contact layer formed on a substrate is divided by isolation grooves formed therein across a region in which IC chips (semiconductor devices) are placed into contacts to be connected to a CLK line (clock line), an I/O line, a $V_{cc}$ line (power lines), a RST line (reset line), a GND line (grounding line) and such. Therefore, when the IC card is bent or a pressure is applied directly to the IC chip, a stress induced in the IC module is concentrated on portions of the substrate around the isolation grooves, and cracks often develop in those portions of the IC chip.

In most cases, cracks are liable to develop in boundary portions of the encapsulating resin on which bending stress is concentrated.

DISCLOSURE OF THE INVENTION

The present invention has been made in view of those problems and it is therefore an object of the present invention to provide an IC card in which physical failures will rarely occur, and an IC module for the IC card.

According to a first aspect of the present invention, an IC card comprises an IC module including a substrate, contacts formed on the substrate, an IC chip mounted on the substrate, and a frame surrounding the IC chip; and a base card on which the IC module is mounted. A deflection, i.e., a change in length per unit undistorted length, of the substrate is greater than that of the base card when a fixed load is applied to the IC card.

According to a second aspect of the present invention, an IC card comprises an IC module including a substrate, contacts formed on one surface of the substrate, an IC chip mounted on the other surface of the substrate, and a frame disposed on the other surface of the substrate so as to surround the IC chip; and a base card on which the IC module is mounted. The width of a contact region in which the contacts are formed is smaller than that of the substrate, the contacts are formed so that the peripheral region of the surface of the substrate is exposed to form a peripheral isolation region, the contacts are isolated from each other by inner isolation regions, and the width of the peripheral isolation region is greater than that of the inner isolation regions.

According to a third aspect of the present invention, an IC card comprises an IC module including a substrate, contacts formed on one surface of the substrate, an IC chip mounted on the other surface of the substrate, and a frame disposed on the other surface of the substrate so as to surround the IC chip; and a base card on which the IC module is mounted. The frame is formed in a rectangular shape in plan view.

According to a fourth aspect of the present invention, an IC module comprises a substrate, contacts formed on the substrate, an IC chip mounted on the substrate, and a frame mounted on the substrate so as to surround the IC chip. A space defined by the frame is filled up with a resin to seal the IC chip, and a deflection of the substrate is greater than that of the resin when a predetermined load is applied to the IC module.

According to a fifth aspect of the present invention, an IC module comprises a substrate, contacts formed on one surface of the substrate, an IC chip mounted on the other surface of the substrate, and a frame mounted on the other surface of the substrate so as to surround the IC chip. The width of a contact region in which the contacts are formed is smaller than that of the substrate, the contacts are formed so that the peripheral region of the surface of the substrate is exposed to form a peripheral isolation region, the contacts are isolated from each other by inner isolation regions, and the width of the peripheral isolation region is greater than that of the inner isolation regions.

According to a sixth aspect of the invention, an IC module comprises a substrate, contacts formed on one surface of the substrate, an IC chip mounted on the other surface of the substrate, and a frame mounted on the other surface of the substrate so as to surround the IC chip. The frame is formed in a rectangular shape.

According to the first to the fourth aspects of the present invention, the IC chip is protected by the frame surrounding the IC chip or by the resin encapsulating the IC chip and portions of the substrate other than those around the IC chip are distorted greatly when an external bending force is applied to the IC card to absorb the external bending force. Consequently, bending stress induced in the portions around the IC chip can be reduced by the portions of the substrate other than those.

According to the second and the fifth aspects of the present invention, the peripheral isolation region, i.e., an exposed portion of the substrate, surrounding the contact region is distorted by an external bending force applied to the IC card to absorb the external bending force. When the width of the peripheral isolation region is greater than that of the inner isolation region, the external bending force can effectively absorbed.

According to the third and the fourth aspect of the present invention, the rectangular frame protects the IC chip effectively.

BEST MODE FOR CARRYING OUT THE INVENTION

First Embodiment

Figure 1A:
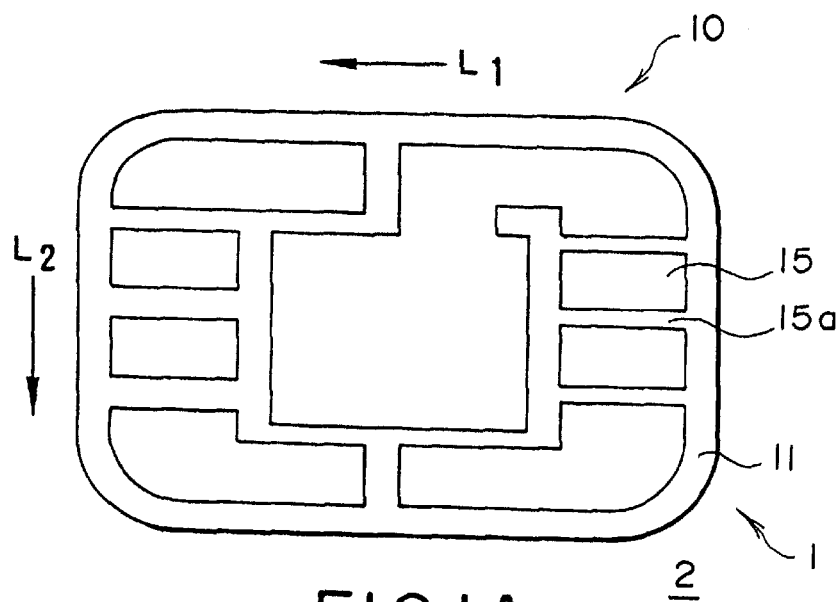
FIG. 1A is a plan view of an IC card in a first embodiment according to the present invention.
Figure 1B:
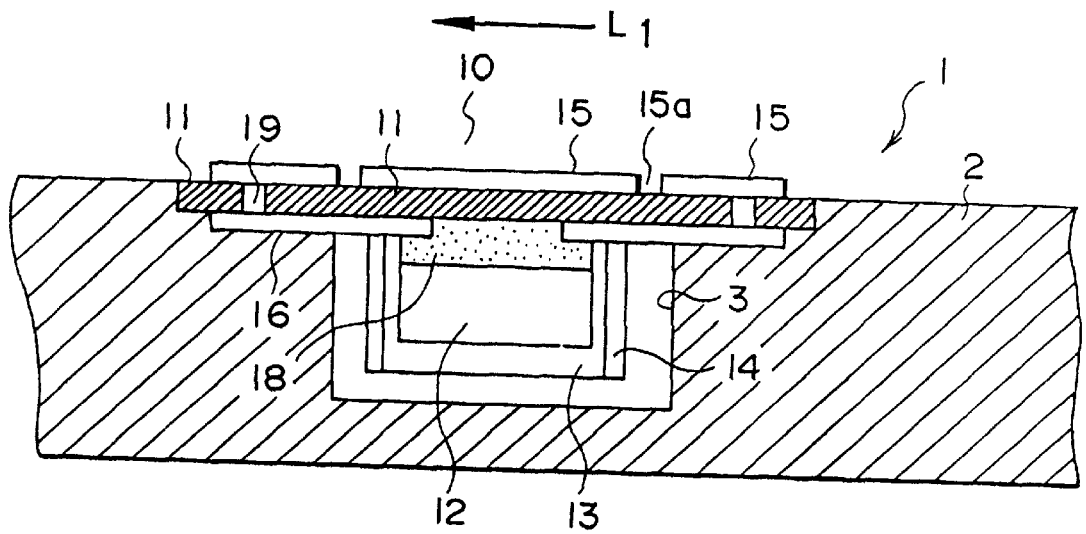
FIG. 1B is a typical sectional side view of the IC card of FIG. 1A.

An IC card in a first embodiment according to the present invention will be described with reference to FIGS. 1A to 8. Referring to FIGS. 1A and 1B, the IC card 1 has a base card 2 of polyvinyl chloride or the like, and an IC module 10 mounted in a cavity 3 formed in the base card 2.

The IC module 10 comprises a substrate 11, contact layer 15 formed on one surface (upper surface) of the substrate 11 and divided into separate contacts by isolation grooves 15a, an anisotropic conductive film 18 attached to the other surface (lower surface) of the substrate 11, an IC chip 12 mounted on the anisotropic conductive film 18, and a frame 14 mounted on the lower surface of the substrate 11 so as to surround the IC chip 12. A space defined by the frame 14 is filled up with an encapsulating resin 13 to seal the IC chip 12 and the anisotropic conductive film 18. The resin 13 is not necessarily indispensable.

Connective lines 16 are extended on the lower surface of the substrate 11 and connected to the anisotropic conductive film 18. Through holes 19 are formed in the substrate 11. The contacts of the contact layer 15 formed on the upper surface of the substrate 11 are connected to the connective lines 16 formed on the lower surface of the substrate 11 via the through holes 19. The connective lines are electrically connected through the anisotropic conductive film 18 to the IC chip 12. Thus, the IC chip 12 is electrically connected through the anisotropic conductive film 18, the connective lines 16 and the through holes 19 to the contacts of the contact layer 15.

The contacts of the contact layer 15 are formed by patterning a copper thin film plated with gold which is to be electrically connected to an external circuit, such as a R/W head.

The respective materials of the encapsulating resin 13 and the substrate 11 of the IC module of the present invention are greatly different in strength from those of the conventional IC modules so that the encapsulating resin 13 and the substrate 11 are hardly subject to cracking.

The substrate 11 may be a 75 μm thick flexible glass epoxy resin substrate. Other possible materials of the substrate 11 are a polyimide resin, a polyester resin, a paper phenol resin, a BT resin and such.

Desirably, the total thickness of a structure including the substrate 11, the contacts of the contact layer 15 and the connective lines 16 is 120 μm or below. In view of securing a cushioning effect on pressure applied through the contacts of the contact layer 15 to the substrate 11, it is preferable that the thickness of the substrate 11 is as close as possible to and not greater than 120 μm.

When the substrate 11 is made of a polyimide resin, the substrate 11 is formed inevitably in a multilayer structure to form the same in an appropriate thickness. A sheet formed by coating a copper foil with a polyimide resin or a sheet formed by laminating layers with a thermoplastic polyimide resin may be used as the substrate 11. In either case, the peel strength of the layers forming the substrate 11 must be higher than the adhesive strength between the encapsulating resin 13 and the substrate 11. The peel strength must be 2 kg or above.

The contacts of the contact layer 15 and the connective lines 16 are formed by patterning copper foils laminated to the opposite surfaces of the substrate 11 by a photolithographic etching process. The copper foils may be rolled copper foils or electroplated copper foils. Electroplated copper foils are preferable in respect of strength of adhesion to the substrate and cost, while rolled copper foils are preferable in respect of flexibility.

The patterned copper foil is plated to form the contacts of the contact layer 15 by hard gold plating, soft gold plating or silver plating. Hard gold plating is preferable in respect of reliability and a preferable thickness of the film formed by plating is 1 µm or above in respect of abrasion resistance.

Preferably, the encapsulating resin 13 has a strength higher than that of the IC chip 12 and a low deformability to protect the IC chip 12 effectively. High-strength, low-deformation resins having an elastic modulus in the range of 1400 to 3000 $kgf/mm^2$ and a breaking strength in the range of 11 to 20 $kgf/mm^2$ (JIS K6911) are effective in preventing the chip crack of the IC chip 12. Resins having a breaking deflection of 1.3 mm or below are preferable.

Figure 5:
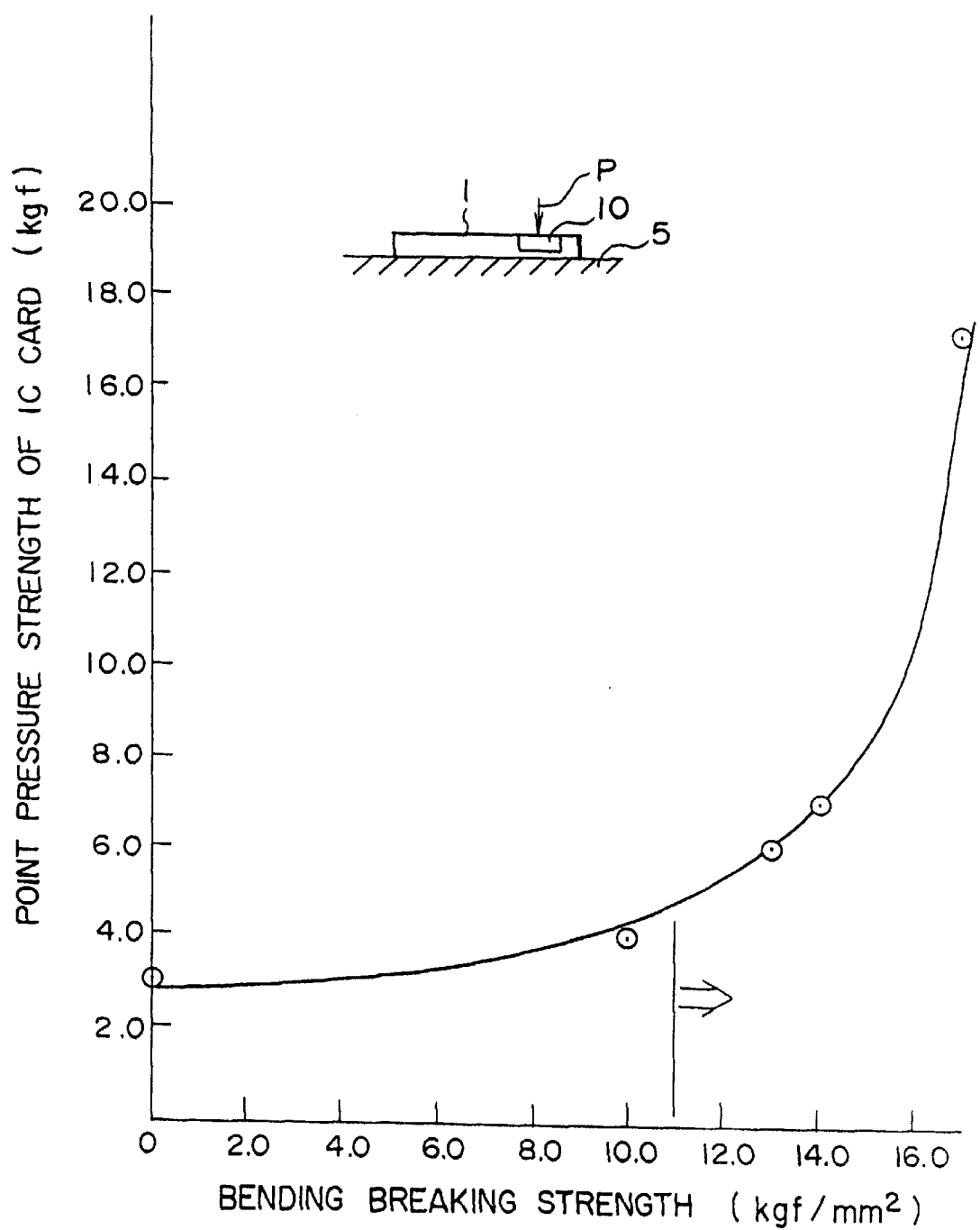
FIG. 5 is a graph showing the relation between the breaking strength of an encapsulating resin and the point pressure strength of an IC card.

Characteristics of the encapsulating resin 13 will be described with reference to FIGS. 5 and 6. FIG. 5 is a graph showing the relation between the breaking strength of an encapsulating resin and the point pressure strength of an IC card. As is obvious from FIG. 5, the point pressure strength of the IC card increases sharply when the breaking strength of the resin increases beyond 11 $kgf/mm^2$.

In FIG. 5, point pressure strength is a force P exerted on an iron ball of 11 mm in diameter placed on a portion of the IC module 10 of the IC card 1 set on a steel plate 5 at the chip crack of the IC chip 12 of the IC module 10 when the iron ball is depressed at a depressing rate of 1 mm/min.

Practically, work for the IC chip 12 with the encapsulating resin 13 is difficult when the breaking strength of the encapsulating resin 13 is higher than 20 $kgf/mm^2$. Therefore, it is preferable that the breaking strength of the encapsulating resin 13 is in the range of 11 to 20 $kgf/mm^2$.

Figure 6A:
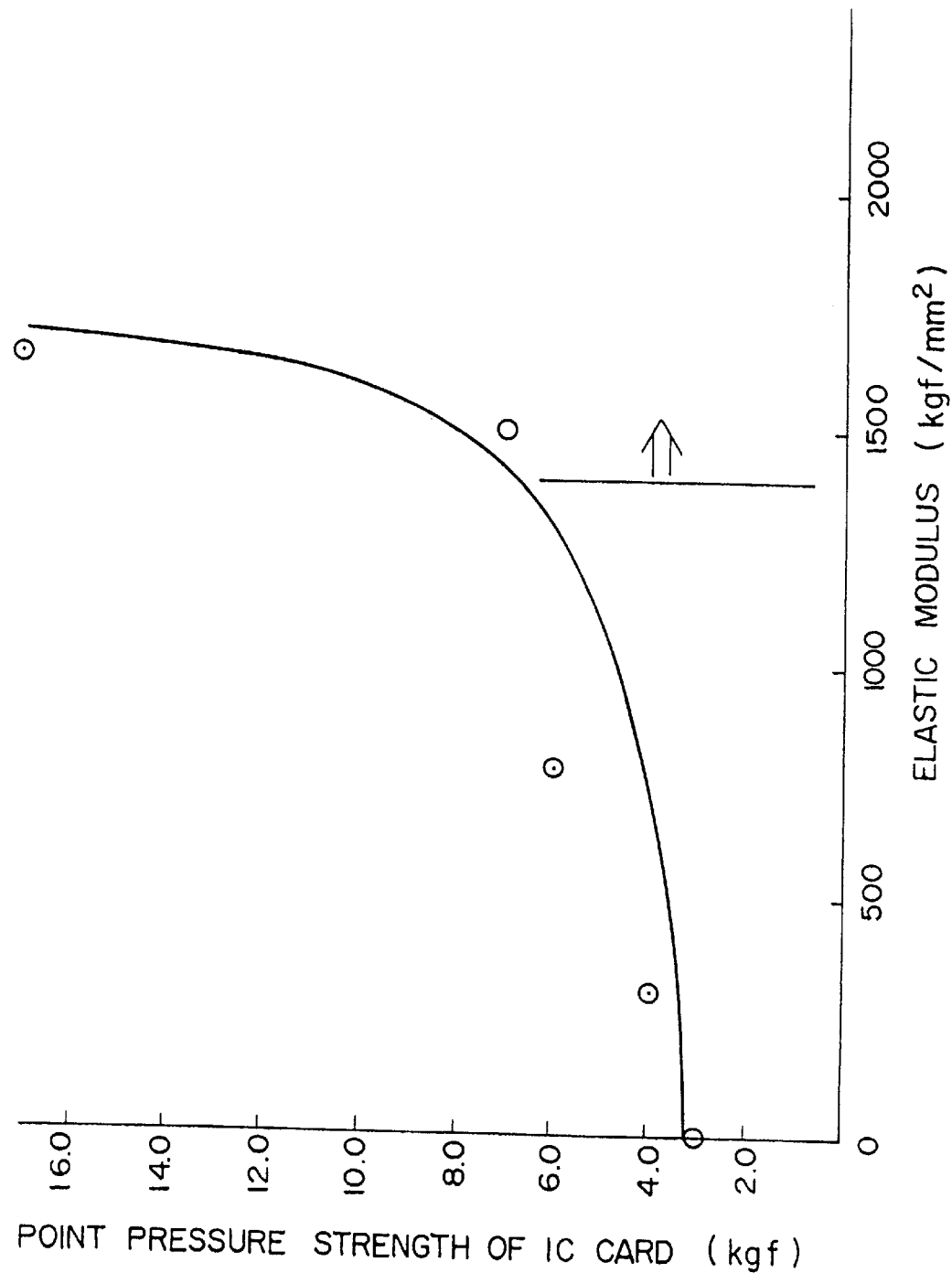
FIG. 6A is a graph showing the relation between the elastic modules of an encapsulating resin and the point pressure strength of an IC card.

FIG. 6A is a graph showing the relation between the elastic modulus of an encapsulating resin and the point pressure strength of an IC card. As is obvious from FIG. 6A, the point pressure strength of the IC card increases sharply when the elastic modulus of the resin increases beyond 1400 $kgf/mm^2$. Practically, work for encapsulating the IC chip 12 with the encapsulating resin 13 is difficult when the elastic modulus of the encapsulating resin 13 is higher than 3000 $kgf/mm^2$. Therefore, it is preferable that the elastic modulus of the encapsulating resin 13 is in the range of 1400 to 3000 $kgf/mm^2$.

Figure 2A:
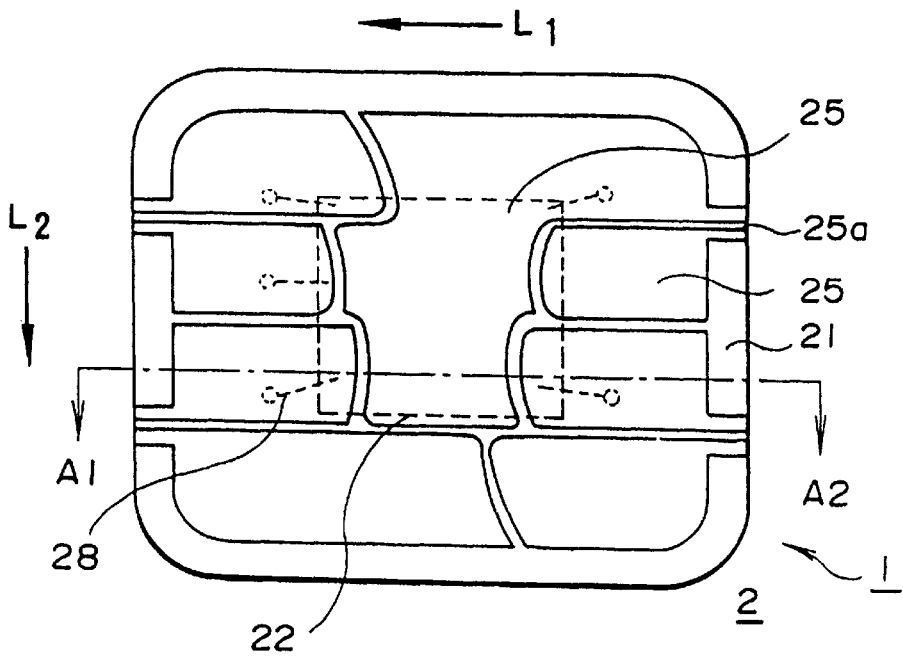
FIG. 2A is a plan view of an IC card in a modified embodiment according to the present invention.
Figure 2B:
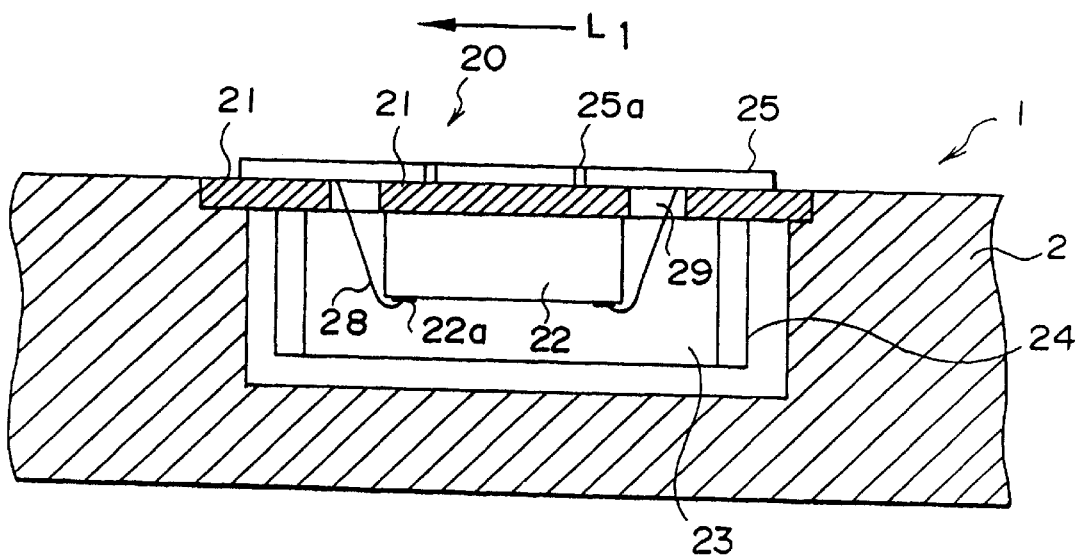
FIG. 2B is a typical sectional side view of the IC card of FIG. 2A.

The operation and effects of IC modules in accordance with the present invention will be described with reference to FIGS. 6B and 6C. Shown in FIG. 6C are an IC module 20a provided with a frame 24 in accordance with the present invention and corresponding to an IC module 20 shown in FIGS. 2A and 2B, and a conventional IC module 20b employing a relatively thick substrate 21 and not provided with any member corresponding to the frame 24. In FIG. 6C, parts like or corresponding to those of the IC module 20 shown in FIGS. 2A and 2B are designated by the same reference characters and the description thereof will be omitted.

Figure 6B:
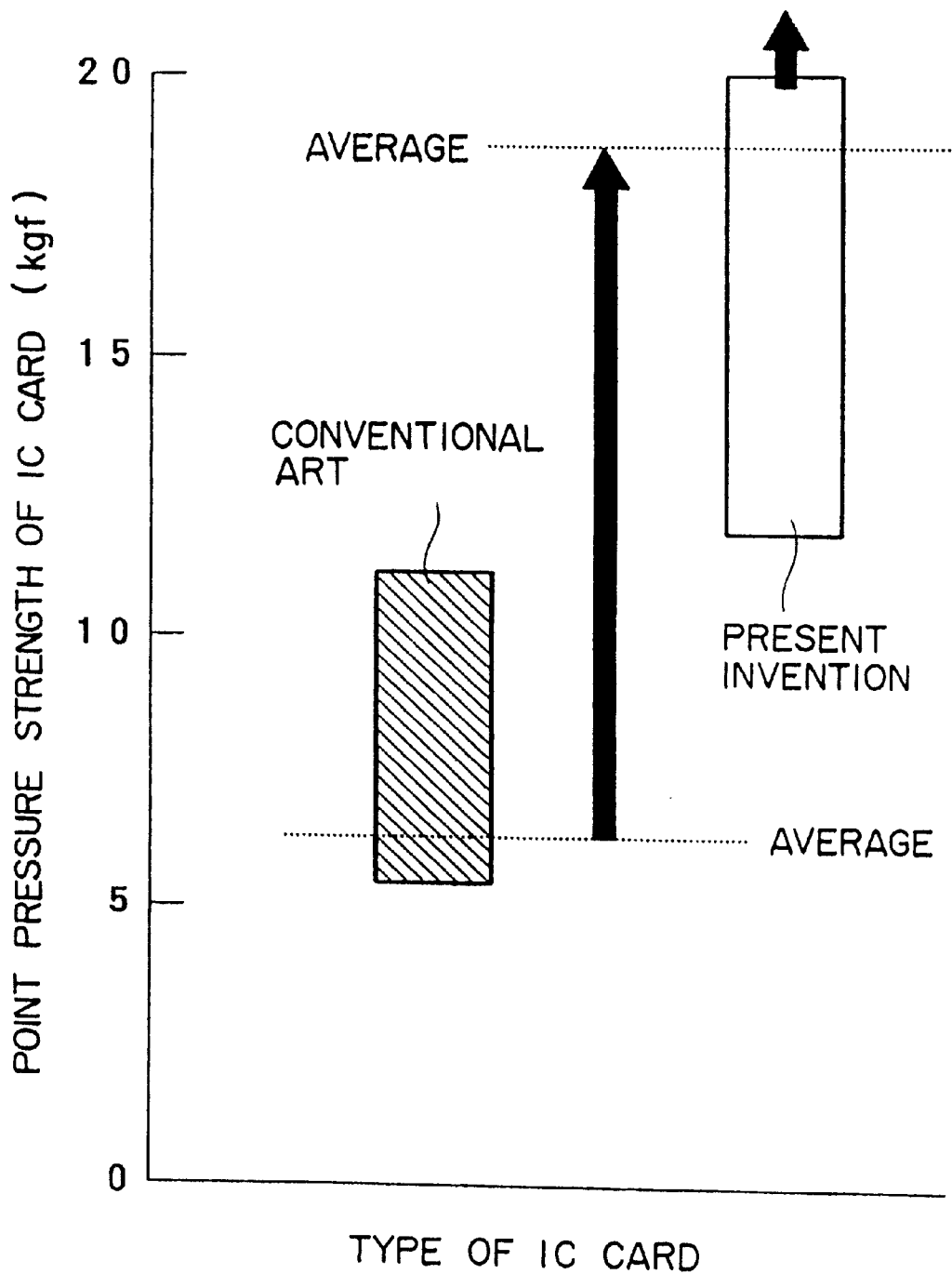
FIG. 6B is a graph comparatively showing the respective point pressure strengths of conventional IC cards and IC cards in accordance with the present invention.
Figure 6C:
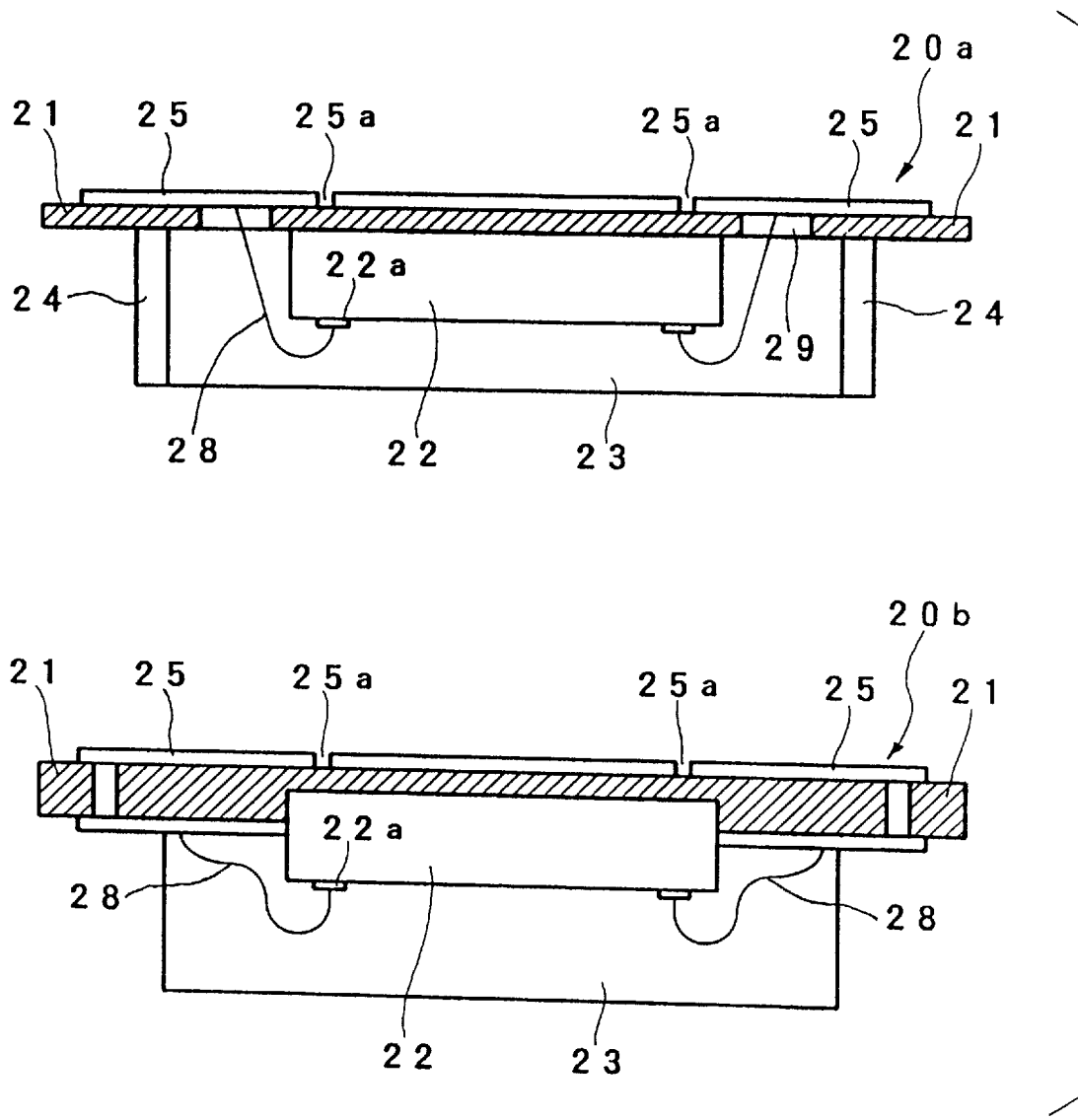
FIG. 6C is a typical sectional view comparatively showing an IC module in accordance with the present invention and a conventional IC module.

As shown in FIG. 6B, the point pressure strengths of IC cards provided with the IC module 20a of the present invention are far higher than those of conventional IC cards provided with the conventional IC module 20b.

The high-strength, low-deformation encapsulating resin has a strength higher than that of an encapsulating resin employed in the conventional IC module. The encapsulating resin 13 having a desired strength as hardened employed in the present invention is prepared by enhancing the cross-linking density of an epoxy resin in a liquid phase at an ordinary temperature, and mixing a filler in flaky particles instead of a filler in spherical particles in the epoxy resin.

The IC chip can be sealed in the encapsulating epoxy resin in a liquid phase at an ordinary temperature by a potting process, a printing process or an injection process. When fabricating the IC module 10, IC chip is sealed in the liquid-phase encapsulating resin by an injection process.

The injection process for encapsulating the IC chip with the liquid-phase encapsulating resin has the following advantages over other current encapsulating processes.

(1) Whereas a transfer molding process needs a mold, an injection process does not need any mold and hence is advantageous in cost over a transfer molding process. An injection process is able to inject the encapsulating resin under a low pressure with high reliability.

(2) An injection process is able to inject an encapsulating resin of a high viscosity which is difficult to inject by a potting process and is suitable for mass production.

(3) Whereas a printing process needs a printing plate, an injection process does not need any printing plate and permits large allowances for the physical properties of the encapsulating resin.

One-part epoxy resins are advantageous in respect of handling facility and quality stability, and phenolic and modified aminic curing agents are suitable in respect of strength of adhesion to the substrate 11.

The encapsulating resin 13 is an epoxy resin, preferably, an epoxy resin having a glass transition temperature $T_g$ in the range of 130 to 200° C. Epoxy resins having a glass transition temperature outside the foregoing range are not preferable because the volume of those having an excessively low glass transition temperature is subject to excessive thermal change and those having an excessively high glass transition temperature are hygroscopic.

The frame 14 having a high strength and high rigidity higher than those of the encapsulating resin 13 is capable of protecting the encapsulating resin 13 when the IC card 1 is bent. Therefore, it is preferable to form the frame 14 of a material having a high rigidity, such as a glass epoxy resin, carbon-fiber-reinforced resin, a zirconium oxide ceramic material or titanium. Since the finer the component fibers of a glass cloth, the higher is the strength of the glass cloth, the strength of the glass cloth can be adjusted by selectively determining the fineness of the component glass fibers.

More concretely, the frame 14 may be formed of a glass epoxy resin of 1600 $kgf/mm^2$ in elastic modulus and 13 $kgf/mm^2$ in bending breaking strength (JIS K6911)

The frame 14 of a glass epoxy resin is combined with the substrate 11 by, for example, the following method.

First, a thermosetting bonding film of an epoxy resin is bonded temporarily to a glass epoxy substrate of a predetermined thickness (0.5 mm) equal to the height of the frame 14.

When wire bonding is to be performed later, a thermoplastic bonding film of a polyimide having a melting point of 150° C. or above higher than a temperature for wire bonding and the setting temperature of the encapsulating resin may be used.

Subsequently, the glass epoxy substrate carrying the thermosetting bonding film temporarily bonded thereto is fastened to a glass epoxy substrate of a thickness greater than the height (0.5 mm) of the frame 14 with a double-coated adhesive tape.

Then, the glass epoxy substrate is held on both sides and fastened with pins or the like using a paper phenol plate, and the glass epoxy substrate is machined in the shape of the frame 14 by a router. A portion of the glass epoxy substrate corresponding to a space defined by the frame 14 is removed first by machining, and then portions of the same around the frame 14 are machined.

The frame 14 thus formed is positioned in place on the substrate 11, and the frame 14 and the substrate 11 are heated at 160° C. for 15 min under a pressure of 240 kgf for thermal bonding to fix the frame 14 to the substrate 11.

The frame 14 may be made of a thermosetting resin or a UV-setting resin by potting or silk printing, molding, injection molding or punching.

Figure 4A:
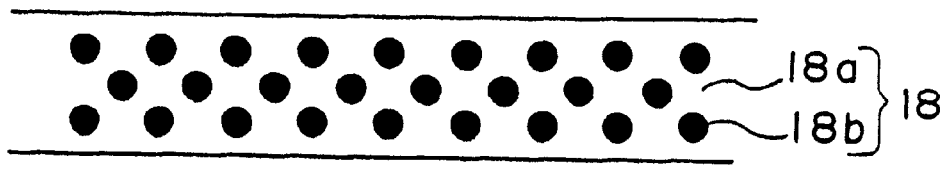
FIG. 4A is a typical view of assistance in explaining the operation of a conductive bonding film.
Figure 4B:
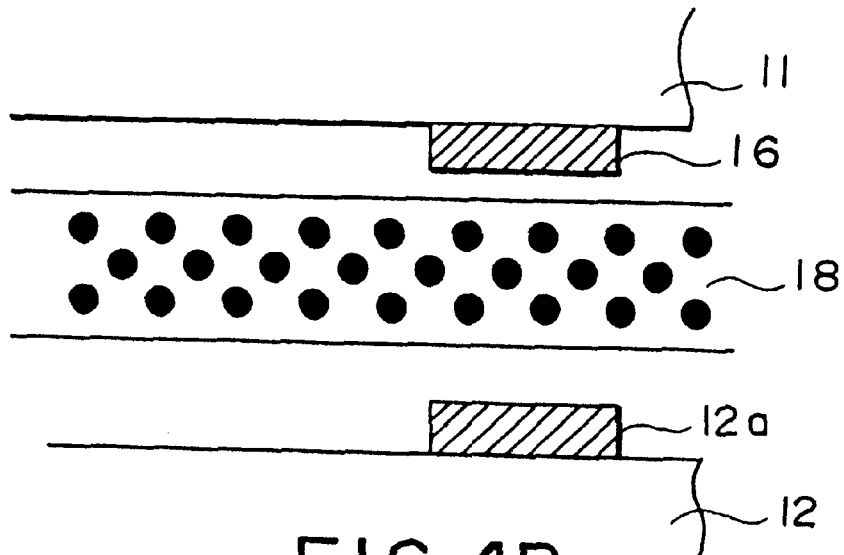
FIG. 4B is a typical view of assistance in explaining the operation of a conductive bonding film.
Figure 4C:
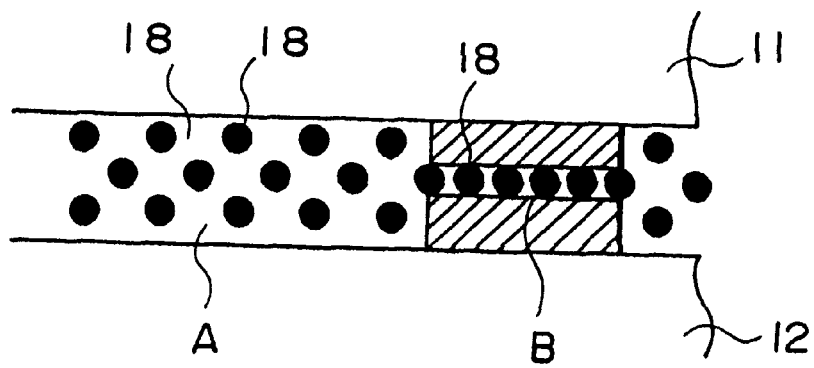
FIG. 4C is a typical view of assistance in explaining the operation of an anisotropic conductive film.

As shown in FIGS. 4A to 4C, the anisotropic conductive film 18 is formed by filling a resin film 18*a* with conductive particles 18*b*. The IC chip 12 is bonded to the substrate 11 with the anisotropic conductive film 18. Electrode pads 12*a* of the IC chip 12 are electrically connected to the connective lines 16 of the substrate 11 with the conductive particles 18*b* as shown in FIG. 4B.

The anisotropic conductive film 18 is a locally conductive film of a thickness on the order of several tens micrometers (preferably, about 30 $\mu$m) consisting of the resin film 18*a* and the conductive particles 18*b* dispersed in the resin film 18*a* as shown in FIG. 4A. The resin film 18*a* is made of a thermosetting resin or a mixture of a thermosetting resin and a thermoplastic resin. "ANISOLM®", an anisotropic conductive film available from Hitachi Chemical Co., Ltd. may be employed as the anisotropic conductive film 18.

The principle of electrical connection achieved by sandwiching the anisotropic conductive film 18 between the substrate 11 and the IC chip 12, and applying pressure and heat to the anisotropic conductive film 18 will be described with reference to FIGS. 4B and 4C. FIG. 4B shows the anisotropic conductive film 18 in a state before the application of pressure and heat thereto, and FIG. 4C shows the anisotropic conductive film 18 after the application of pressure and heat thereto.

When the anisotropic conductive film 18 is changed from the state shown in FIG. 4B to that shown in FIG. 4C, the anisotropic conductive film 18 is pressed and heated through the substrate 11 and the IC chip 12 and, consequently, the electrode pads 12*a* of the IC chip 12 corresponding to the connective lines 16 of the substrate 11 are electrically connected through the conductive particles 18*b* to the corresponding connective lines 16. The electrode pads 12*a* of the IC chip 12 not corresponding to any connective lines 16 are not connected electrically to the connective lines 16. Thus, only the circuits of the IC chip to be connected to the connective lines 16 are electrically connected through the conductive particles 18*b* to the connective lines 16.

The connective lines 16 of the substrate 11 need not necessarily be connected electrically to the IC chip 12 by the foregoing method described by way of example.

Since the connective lines 16 of the substrate 11 can firmly and uniformly be bonded to the IC chip 12 with the anisotropic conductive film 18, the IC chip 12 will not be separated from the substrate 11 and the IC chip 12 will not be cracked even if a stress is induced in the IC chip 12. Since the substrate 11 and the IC chip 12 are bonded together without using any wire, failures due to the disconnection of wires will not occur at all.

The frame 14 is formed in the least necessary dimensions. The formation of the encapsulating resin 13 surrounded by the frame in the least possible dimensions is effective in preventing chip crack.

The relation between the respective strengths of the substrate 11 of the IC module 10, the encapsulating resin 13 and the frame 14 and that of the base card 2 of the IC card 1 will be described hereinafter.

Generally, according to JIS K6911, a deflection Y in a test beam of a rectangular cross section when the test beam is supported at both ends and loaded by a vertical load is expressed by Expression (1).

$$Y = \frac{F \times l^3}{4Wh^3 \times E} \quad (1)$$

where:
Y=deflection (mm)
F=load on test beam (kgf)
W=width of the test beam (mm)
h=height of the test beam (mm)
l=distance between the supports (mm)
E=elastic modulus (kgf/mm$^2$)

In expression (1), deflection per unit length when a predetermined load is loaded on the test beam is expressed by Expression (2)

$$Y' = \frac{1}{Wh^3 \times E} \times C \quad (2)$$

where C is a constant.

As is obvious from Expression (2), the deflection Y' per unit length under the predetermined load is proportional to 1/Wh$^3$×E.

Since the moment of inertia of cross section I of the test beam is Wh$^3$/12, Expression (2) can be rearranged to obtain Expression (3).

$$Y' = \frac{1}{IE} \times C \quad (3)$$

The deflection Y per unit length under the predetermined load is proportional to 1/EI.

Deflections Y' per unit length in the substrate 11, the encapsulating resin 13, the frame 14 and the base card 2 meet the relation expressed by Expression (4).

Y' in substrate 11>Y' in base card 2>Y' in encapsulating resin 13>Y' in frame 14 (4)

When a predetermined load is loaded on a unit length, the magnitude of the deflections in the substrate 11, the base card 2, the encapsulating resin 13 and the frame 14 decreases in that order. When the substrate 11, the base card 2, the encapsulating resin 13 and the frame 14 are bent in that decreasing order, the IC chip 12 and the contiguous parts are protected by the frame 14 and the encapsulating resin 13, and portions of the substrate 11 other than a portion of the same corresponding to the IC chip 12 are allowed to be bent greatly, so that the bending force applied to the IC card 1 can be absorbed by the substrate 11. In FIGS. 1A and 1B, the arrow L$_1$ indicates a direction in which the longer edges of the IC module 10 extend and the arrow L$_2$ indicates a direction in which the shorter edges of the same extend.

FIG. 2A is a plan view of a modified embodiment of the present invention and FIG. 2B is a sectional view taken on line A1–A2 in FIG. 2A.

Referring to FIGS. 2A and 2B showing an IC card 1, the IC card 1 is provided with an IC module 20 comprising a substrate 21, an IC chip (semiconductor devices) 22, an encapsulating resin 23, a frame 24, contacts 25 isolated from each other by isolation grooves 25a, and wires 28.

The IC chip 22 is attached to the lower surface of the substrate 21, and electrode pads 22a included in the IC chip 22 are electrically connected to the contacts 25 by wires 28 extended through gaps 29. The encapsulating resin 23 is reinforced by a frame 24.

In the IC card 1 shown in FIGS. 2A and 2B, materials of a base card 2, the substrate 21, the encapsulating resin 23 and the frame 24 are substantially the same as those of the base card 2, the substrate 11, the encapsulating resin 13 and the frame 14 shown in FIGS. 1A and 1B, respectively.

The IC card 1 of FIGS. 2A and 2B is not provided with any through holes and hence the IC card of FIGS. 2A and 2B is advantageous in cost and productivity of processes for fabricating IC cards over the IC card 1 of FIGS. 1A and 1B.

As shown in FIGS. 2A and 2B, the wires 28 of the IC module 20 are extended so as not to cross the isolation grooves 25a isolating the contacts 25 from each other.

As shown in FIG. 2A, the contacts 25 are formed by dividing a contact layer by the isolation grooves 25a. The isolation grooves 25a extending in a direction L1 parallel to the longer edges of the contact layer are straight, and the isolation grooves 25a extending substantially in a direction L2 parallel to the shorter edges of the contact layer are curved so that the edges of the contacts 25 on the side of the center of the substrate 21 are curved convexly toward the central portion of the contact layer, and the curved edges of the contacts 25 are arranged zigzag to avoid the concentration of bending stress. In FIG. 2A, the IC chip 22 and the wires 28 are indicated by dotted lines to facilitate understanding the positional relation between the components of the IC card 1.

Since the contacts 25 are isolated from each other by the isolation grooves 25a formed in the shape as mentioned above, stress is not concentrated on a specific portion of the contact layer forming the contacts 25 and distributed when the IC card 1 is bent, particularly, when the IC card 1 is bent so that the longer edges of the IC card 1 are curved. Consequently, bending stress induced in the IC chip 22 under the contacts 25, the wires 28, the encapsulating resin 23 and the frame 24 can be reduced to a very low extent.

Figure 3A:
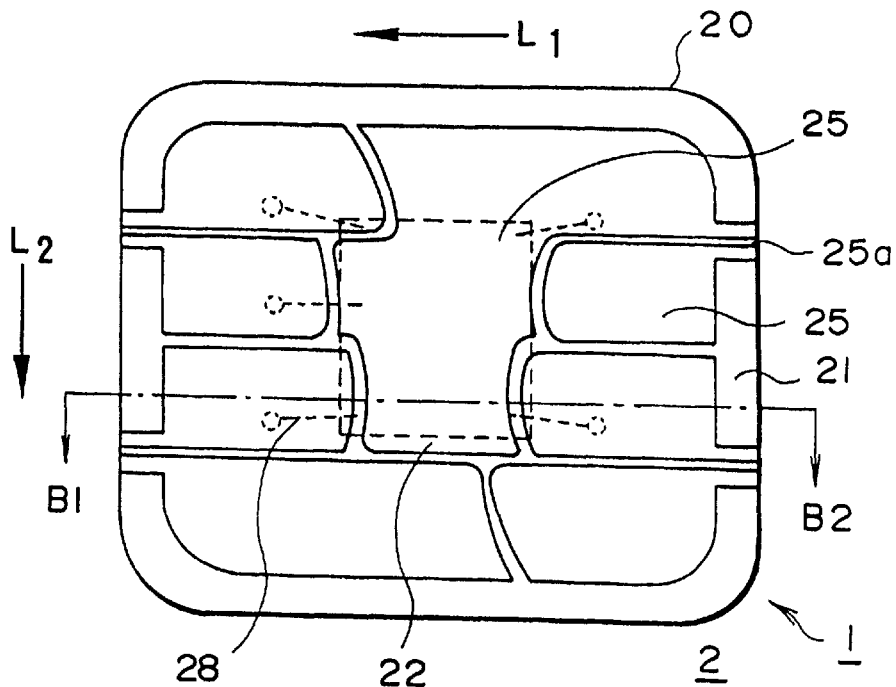
FIG. 3A is a plan view of an IC card in another modified embodiment according to the present invention.
Figure 3B:
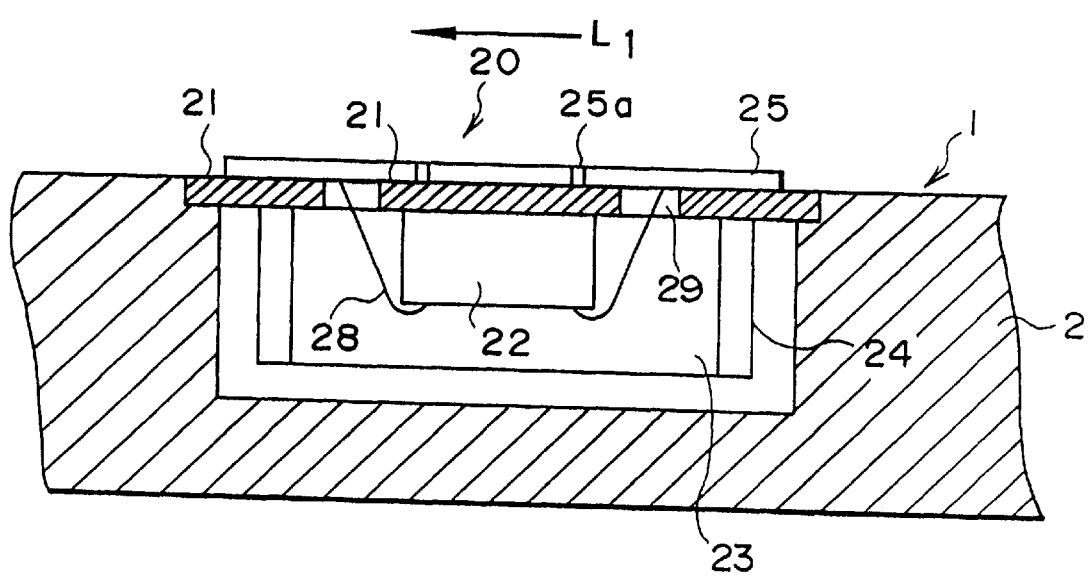
FIG. 3B is a typical sectional side view of the IC card of FIG. 3A.

FIGS. 3A and 3B show an IC card 1 in another modified embodiment. FIG. 3A is a plan view of the IC card 1 and FIG. 3B is a sectional view taken on line B1–B2 in FIG. 3A.

In an IC module 20 shown in FIGS. 3A and 3B, wires 28 are extended across isolation grooves 25a isolating contacts 25 from each other. In FIG. 3A, an IC chip 22 and the wires 28 are indicated by dotted lines to facilitate understanding the positional relation between the components of the IC card 1.

The materials of a base card 2, a substrate 21, an encapsulating resin 23 and a frame 24 shown in FIGS. 3A and 3B are substantially the same as those of the base card 2, the substrate 11, the encapsulating resin 13 and the frame 14 shown in FIGS. 1A and 1B, respectively.

It was found through the practical use of the IC cards shown in FIGS. 1A, 1B, 2A, 2B, 3A and 3B that physical failures in the IC modules attributable to the bending of the IC cards were less than those occurred in the conventional IC cards. Particularly, development of cracks in the IC chips was reduced significantly. Physical failures did not occur in the IC module 10 even when the IC card 1 of the present invention was bent greatly to an extent in which the IC card 1 was distorted permanently.

Since the IC modules 10 and 20 of the present invention for an IC card are stronger than the conventional IC modules, physical failures in the IC modules 10 and 20 due to the bending of the IC card 1 can be reduced. Particularly, the possibility of cracking of the IC chips 12 and 22, and breakage of the encapsulating resins can significantly be reduced.

Second Embodiment

An IC card in a second embodiment according to the present invention will be described hereinafter. The IC card 1 in the second embodiment is substantially the same in construction as the IC card 1 in the first embodiment shown in FIGS. 1A and 1B, except that the material of a encapsulating resin 13 included in an IC module 10 employed in the IC card 1 in the second embodiment is different from that of the encapsulating resin 13 of the IC card in the first embodiment.

The encapsulating resin 13 is a mixture of an epoxy resin and a curing agent. The epoxy resin is of the bisphenol A type, the bisphenol F type, the alicyclic type or the polyglycol group. The curing agent is an acid anhydride, such as a fatty acid anhydride, an aromatic anhydride or a chlorinated acid anhydride, or a denatured amine, such as aliphatic polyamine, alicyclic polyamine, aromatic polyamine or polyamide polyamine.

It is known empirically that the reliability of the IC module 10 is greatly dependent on the physical strength of the encapsulating resin 13. Materials that affect the strength of the encapsulating resin 13 significantly are roughly classified into fillers and softening agents.

According to the results of studies made by the inventors of the present invention, resins having a high bending breaking strength, a high elastic modulus, a high strength and a high rigidity are desirable for use as an encapsulating resin 13 of a highly reliable IC module 10. A filler is added to a resin to obtain an encapsulating resin 13 having such physical properties.

The filler is an aggregation of spherical or flaky particles of silica, quartz, aluminum hydroxide, calcium carbonate, titanium oxide or such. The filler content of the encapsulating resin 13 is 70% or above. The strength of the encapsulating resin can further be improved by adding an additive filler of crystal whiskers having the shape of a tetrapod. The additive filler is an aggregation of whiskers having the shape of a tetrapod of a ceramic material of a metal or an oxide, such as MgO, ZnO, $TiO_2$ or $Al_2O_3$, a ceramic material of a double oxide, such as potassium titanate, aluminum borate or basic magnesium sulfate, a ceramic material of a nonoxide, such as silicon carbide or silicon nitride, a ceramic material of graphite, $CaCO_3$, $ZnCo_3$, $Mg(OH)_2$ or the like, or an organic polymer, such as polyoxymethylene or a liquid crystal polymer.

A resin employed in the present invention contains a spherical silica powder of 10 to 30 $\mu$m in particle size in a filler content of 78%. This resin contributes to forming a high-strength IC module 10. The filler contained in the resin contains tetrapod-shaped crystal whiskers of an additive filler in an additive filler content of 10%, which improves the strength of the resin by about 20% or above. An additive filler content exceeding 10% is practically disadvantageous because an excessive additive filler content increases the viscosity of the resin, unavoidably deteriorating handling facility.

A flexible resin, such as epoxydated silicone, urethane, polybutadiene or an acrylic elastomer, contained in the resin employed in the conventional IC module as a softening agent increases the deformation of the resin and is liable to cause breakage of the IC chip. Therefore, the encapsulating resin employed in the present invention does not contain any softening agent.

The glass transition temperature $T_g$ and the cross-linking density, which affects the physical strength, of the encapsulating resin are closely correlated. The strength of an encapsulating resin having an excessively low glass transition temperature is insufficient, and an encapsulating resin having an excessively high glass transition temperature is brittle. An encapsulating resin having a glass transition temperature in the range of 130° C. to 180° C. is desirable.

Figure 7:
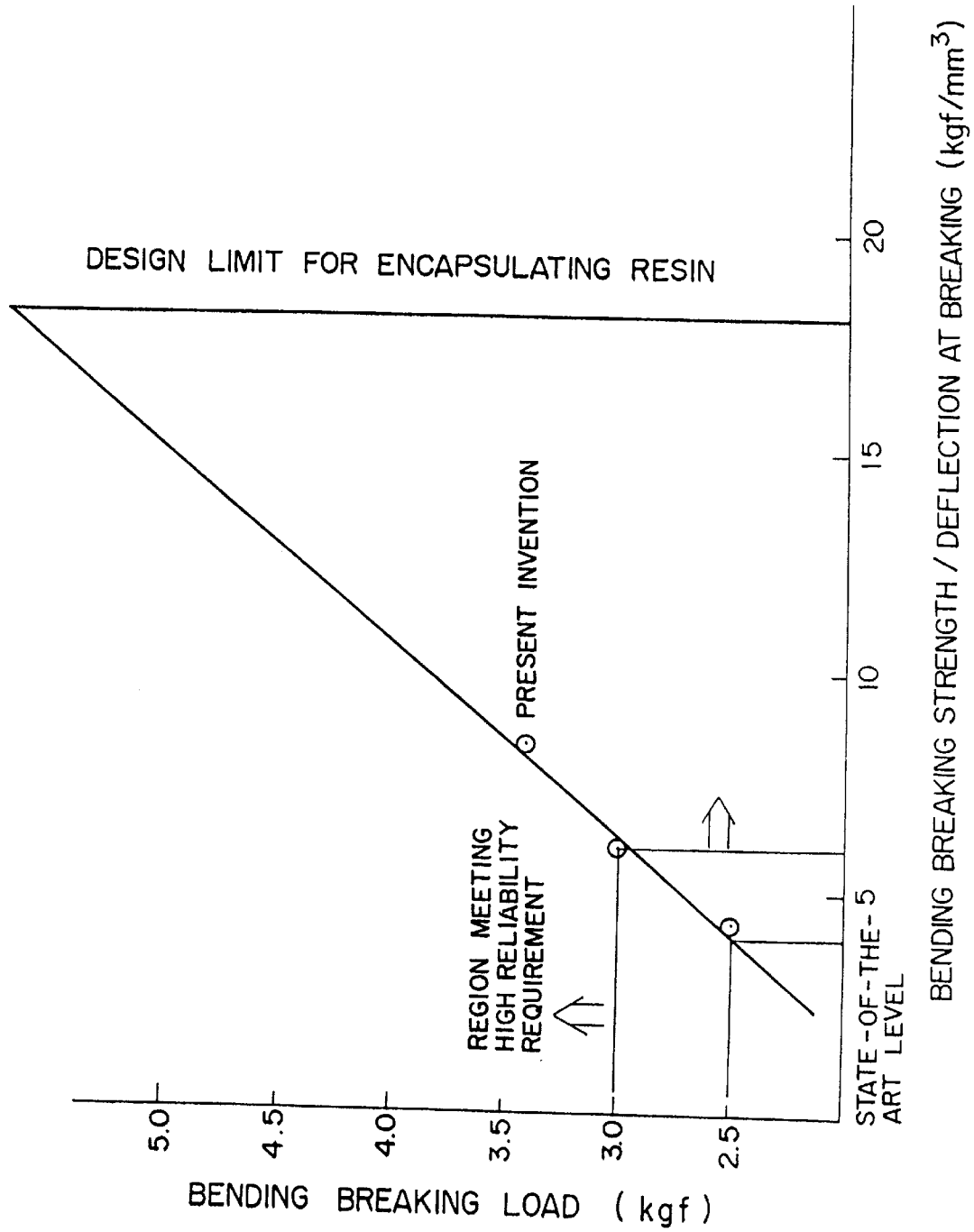
FIG. 7 is a graph showing the relation between the ratio of the breaking strength of test resin beams to the fracture deflection of the same and the breaking strength at bending fracture of IC cards.

The inventors of the present invention measured the bending breaking strength and the deflection at breaking (fracture) of resins for the encapsulating resin 13 by loading test beams of resins having a rectangular cross section and supported at both ends by a test method specified in JIS K6911, examined the relation between the ratio S=(bending breaking strength)/(deflection at breaking) of the test beams of resins and the breaking strength H at bending fracture of IC cards, and found that there is a correlation as shown in FIG. 7 between the ratio S and the breaking strength H.

The breaking strength H at bending breaking of the IC card is equal to a maximum load on the IC CARD at the breakage of the IC chip encapsulated in the encapsulating resin 13 when an increasing load is applied to the IC card supported at both ends.

Figure 8:
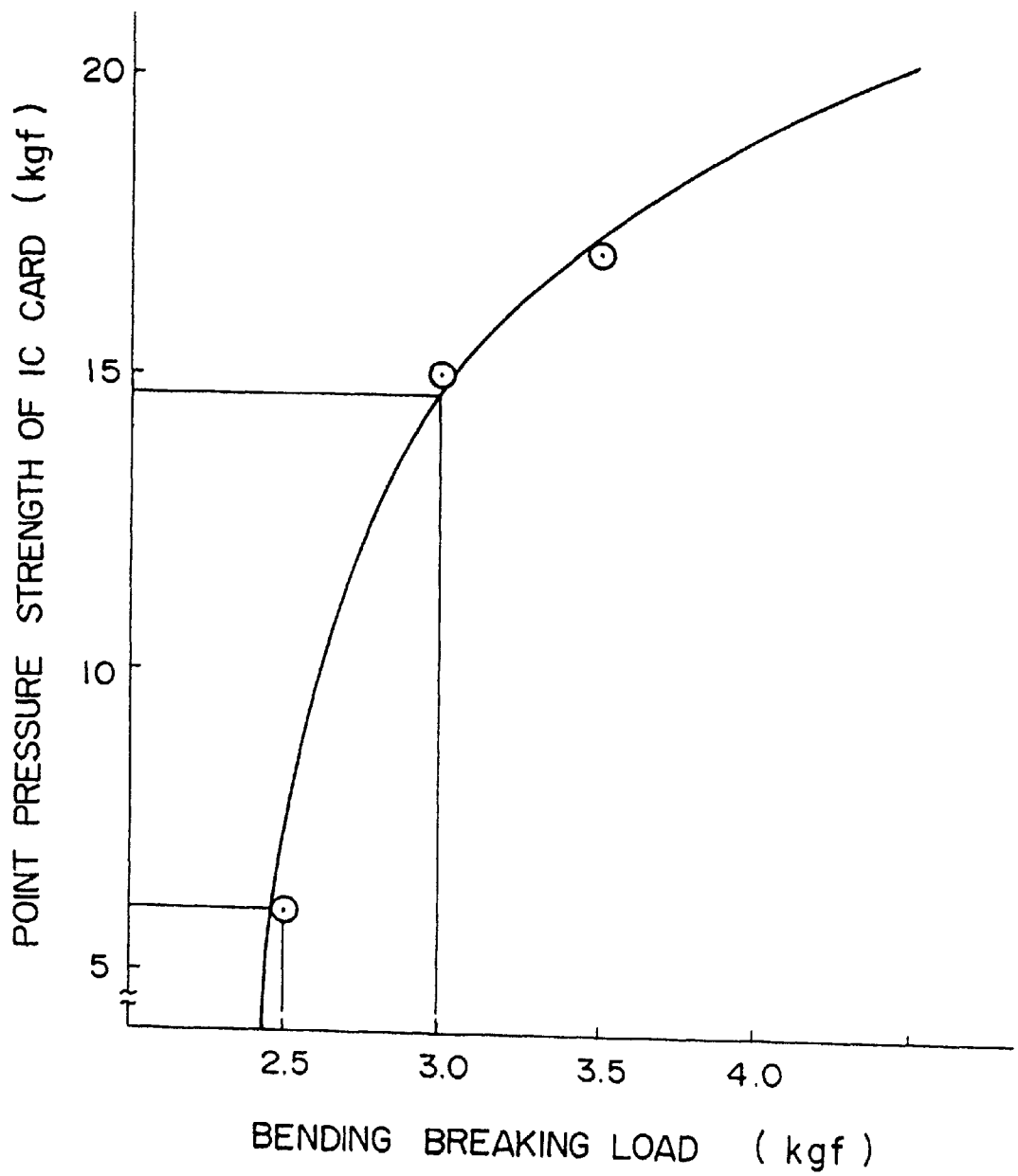
FIG. 8 is a graph showing the relation between the breaking strength at bending fracture and the point pressure strength of IC cards.

FIG. 8 shows the relation between the breaking strength H at bending fracture of the IC card and the point pressure strength of the IC card. The definition of the point pressure strength of the IC card shown in FIG. 8 is the same as that previously explained with reference to FIG. 5.

The breaking strengths at bending fracture of IC cards currently used for practical uses are on the order of 2.5 kgf. It is known from the relation between the breaking strength H and the point pressure strength of IC cards shown in FIG. 8 that the point pressure strength of IC cards increases sharply when the breaking strength H increases beyond 2.5 kgf. Therefore, as is obvious from FIG. 7, the ratio S=(bending breaking strength)/(deflection at breaking) must be 4 kgf/mm$^3$ or above to secure a bending breaking strength of 2.5 kgf or above. In an IC card intended to be used for purposes in which high reliability is important, it is desirable that the bending breaking strength H is 3 kgf or above in view of securing sufficient physical strength and point pressure strength, and hence the ratio S must be 6 kgf/mm$^3$ or above. Although a larger value of the ratio S is more desirable, the upper limit of the ratio S of resins may be on the order of 18 kgf/mm$^3$ in the state of the art. When the ratio S is 18 kgf/mm$^3$, the resin has a breaking strength of 20 kgf/mm$^2$ and a breaking strain of about 1.1%.

A resin with the ratio S greater than 18 kgf/mm$^3$ is very difficult to handle when encapsulating the IC chip and not suitable for practical use. It is known from the minute examination of the encapsulating resin 13 after the breakage of the IC module 10 that the encapsulating resin 13 is broken by plastic failure. Therefore, the real mode of breakage of the IC module 10 can be estimated from the ratio S=(bending breaking strength)/(deflection at fracture) representing the physical properties of the resin at fracture.

Third Embodiment

Figure 9A:
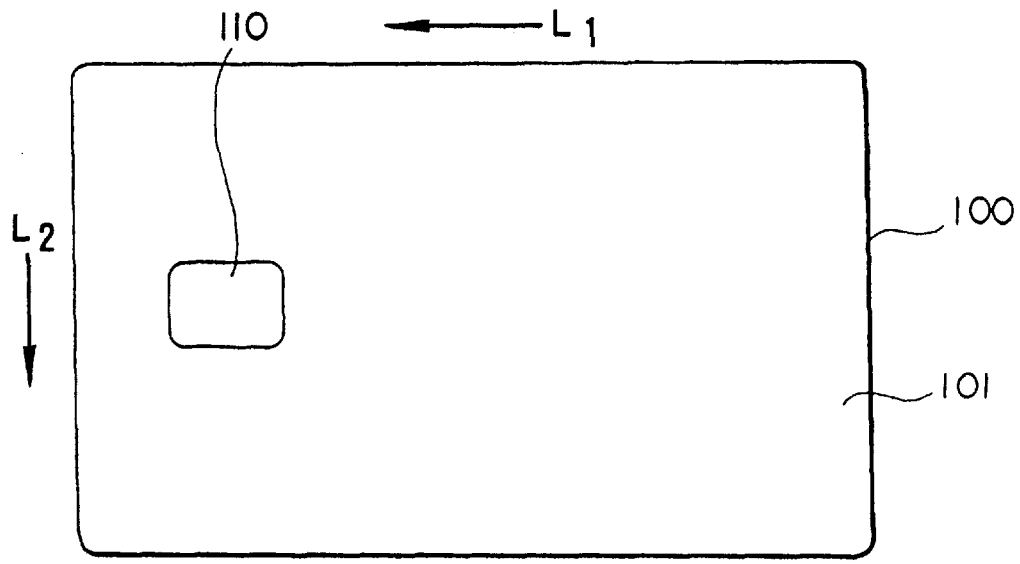
FIG. 9A is a plan view of an IC card in a third embodiment according to the present invention.
Figure 9B:
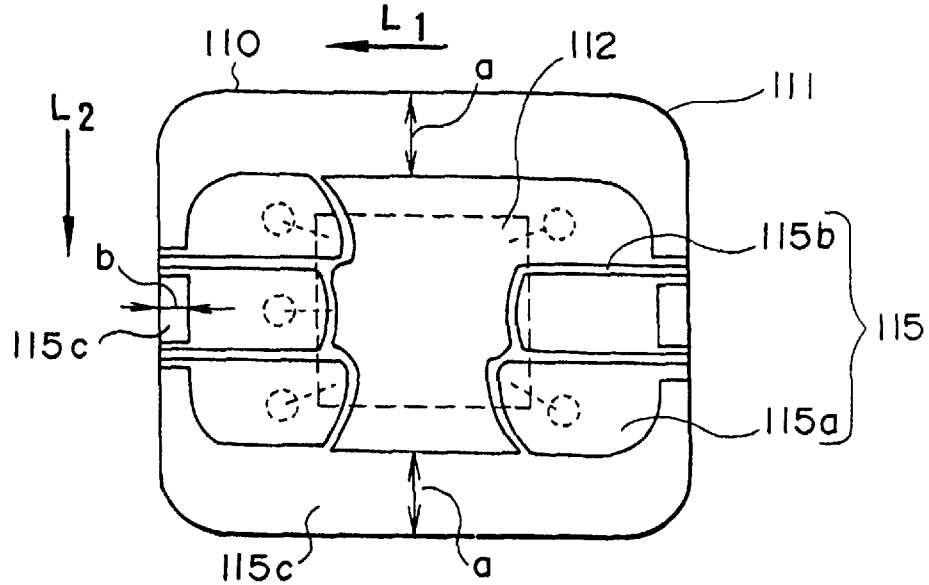
FIG. 9B is a plan view of an IC module included in the IC card of FIG. 9A.
Figure 9C:
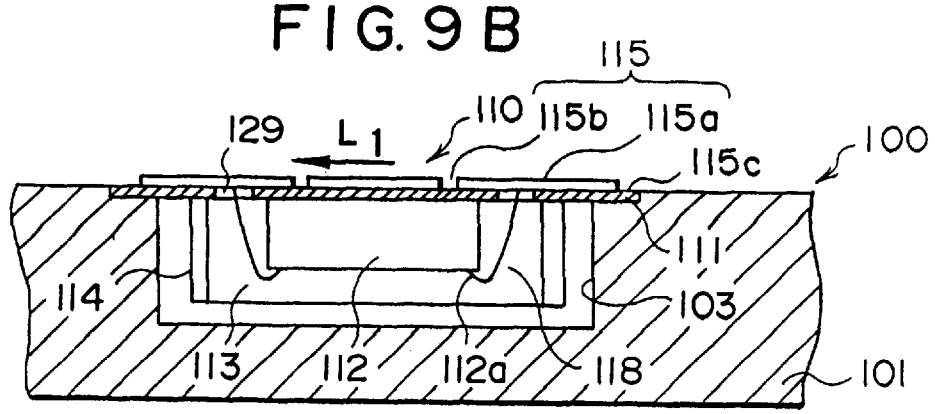
FIG. 9C is a typical sectional side view of the IC card of FIG. 9A.

An IC card 100 in a third embodiment according to the present invention will be described with reference to FIGS. 9A to 11. As shown in FIGS. 9A to 9C, the IC card 100 has a base card 101 of polyvinyl chloride or the like, and an IC module 110 placed in a cavity 103 formed in the base card 101. FIG. 9A is a plan view of the IC card 10, FIG. 9B is a plan view of the IC module 110 and FIG. 9C is a sectional side view of the IC module 110.

The IC module 110 comprises a substrate 111, contacts 115a formed by dividing a contact layer 115 formed on one surface (upper surface) of the substrate 111 by isolation grooves 115b (inner isolation region), an IC chip 112 attached to the other surface (lower surface) of the substrate 111, and a frame 114 attached to the lower surface of the substrate 111 so as to surround the IC chip 112.

Electrode pads 112a included in the IC chip 112 are electrically connected to the contacts 115a by wires 118 extended through holes 129 formed in the substrate 111, respectively. A space defined by the frame 114 is filled up with an encapsulating resin 113 so as to encapsulate the IC chip 112.

As shown in FIGS. 9A to 9C, the plane size of the contact layer 115 forming the contacts 115a is smaller than that of the substrate 111, and a peripheral isolation region 115c in which a portion of the upper surface of the substrate 111 is exposed, is formed around the contact layer forming the contacts 115a. The longer sections, i.e., the sections extending in a direction $L_1$ in which the longer edges of the base card 101 extend, of the peripheral isolation region 115c have a width a, and the shorter sections, i.e., the sections extending in a direction $L_2$ in which the shorter edges of the base card 101 extend, of the peripheral isolation region 115c have a width b. The widths a and b of the sections of the peripheral isolation region 115c are greater than the width of the isolation grooves 115b. Preferably, the widths a and b the peripheral isolation region 115c for the base card 101 of a plane size of 54.03 mm×85.72 mm specified in ISO Standards are in ranges expressed by:

0.2 mm<a<28.02 mm 0.2 mm<b<65.85 mm

The widths a and b are maximized when the substrate 111 of the IC module 110 is enlarged so that the edges thereof coincide with the those of the base card 101, respectively.

More concretely, the widths a and b are 0.6 mm and 0.3 mm, respectively, which are considerably greater than those of the corresponding sections of the outer isolating region of the conventional IC module.

Materials of the components of the IC card 100 will be described hereinafter. The substrate 111 of the IC module 110 is a 75 μm thick glass epoxy substrate, and the base card 101 is made of vinyl chloride. The deflection per unit length of the substrate 111 of the IC module 110 is greater than that of the base card 101 under a predetermined load (Expression (4)).

When the deflection per unit length of the substrate 111 under a predetermined load is larger than that of the base card 101, and the widths a and b of the sides of the outer insulating region 115c are relatively big, bending stress induced in the IC card 100 when the IC card 100 is bent can be absorbed by the flexible peripheral isolation region 115c and, consequently, the development of cracks in the IC chip 112 or the encapsulating resin 113 can be prevented.

The IC module 110 in the third embodiment has a simple construction not provided with any through holes and hence is advantageous in cost and productivity of processes for assembly the same.

In the IC module 110, the wires 118 do not cross the insulating grooves 115b. The contact layer 115 is divided by the isolation grooves 115b into the plurality of contacts 115a as shown in FIG. 9B. The isolation grooves 115b extending in parallel to the longer sides of the IC module 110 are straight, and the isolation grooves 115b extending substantially along the shorter sides of the IC module 110 are curved so that the edges of the contacts 115a on the side of the center of the contact layer 115 are curved convexly toward the central portion of the contact layer 115, and the curved edges of the contacts 115a are arranged zigzag. In FIG. 9A, the IC chip 112 and the wires 118 are indicated by dotted lines to facilitate understanding the positional relation between the components of the IC card 100.

Since the contacts 115a are formed by dividing the contact layer 115 by the isolation grooves 115b, stress is not concentrated on a specific portion of the hard contact layer 115 and distributed over the soft substrate 111 because isolation grooves 115b are formed in the shape as mentioned above when the IC card 100 is bent, particularly, when the IC card 100 is bent so that the longer edges of the IC card 1 are curved. Consequently, bending stress induced in the IC chip 112 under the contact layer 115, the wires 118, the encapsulating resin 113 and the frame 114 can be reduced to a very low extent.

The substrate 111 of the IC module employed in this embodiment is a flexible 75 μm thick glass epoxy substrate. As mentioned above, the substrate 111 is more flexible than the base card 101 of vinyl chloride, and a deflection per unit length under a predetermined load of the substrate 111 is greater than that of the card base 101.

The substrate 111 may be a polyimide substrate, a polyester substrate, a paper phenol substrate or a BT resin substrate.

Desirable sum of the respective thicknesses of the substrate 111 and the contact layer 115 is 120 μm or below. Preferably, the thickness of the substrate 111 takes as large part of 120 μm as possible in view of securing a cushioning property to yield properly to pressure applied to the contact layer 115.

When the substrate 111 is made of a polyimide resin, the substrate 111 is formed inevitably in a multilayer structure to form the same in an appropriate thickness. A sheet formed by coating a copper foil with a polyimide resin without using any adhesive or a sheet formed by laminating layers with a thermoplastic polyimide resin may be used as the substrate 111. In either case, the peel strength of the layers forming the substrate 111 must be higher than the adhesive strength between the encapsulating resin 113 and the substrate 111. The peel strength must be 2 kg or above.

Figure 11:
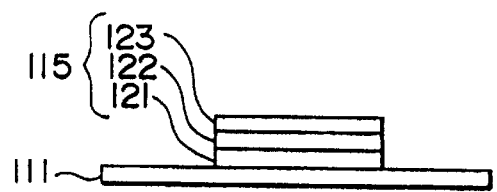
FIG. 11 is a side view of a substrate and contacts included in an IC module.

The contact layer 115 will be described with reference to FIG. 11 showing the relation between the substrate 111 and the contact layer 115.

As shown in FIG. 11, a copper foil 121 laminated to the substrate 111 of the IC module 110 is processed by a photolithographic etching process. The copper foil 121 may be a rolled copper foil or an electroplated copper foil. An electroplated copper foil is preferable in respect of strength of adhesion to the substrate 111, while a rolled copper foil is preferable in respect of flexibility.

An underlayer 122 is formed over the copper foil 121 by plating, and a hard gold plate layer 123 is formed over the underlayer 122 to complete the contact layer 115. A soft gold plate or a silver plate may be employed instead of the hard gold plate 123. The hard gold plate is preferable in respect of reliability and a preferable thickness of the soft gold plate is 1 μm or above in respect of abrasion resistance.

Preferably, the encapsulating resin 113 of the IC module 110 has a strength higher than that of the IC chip 112 (semiconductor device) and a low deformability to protect the IC chip 112 effectively. High-strength, low-deformation resins having an elastic modulus in the range of 1400 to 3000 kgf/mm$^2$ and a breaking strength in the range of 11 to 20 kgf/mm$^2$ (JIS K6911) are effective in preventing the breakage of the IC chip 112. Resins having a breaking deflection of 1.3 mm or below are preferable.

The frame 114 having a high strength and high rigidity higher than those of the encapsulating resin 113 is capable of protecting the encapsulating resin 113 when the IC card 100 is bent. Therefore, it is preferable to form the frame 114 of a material having a high rigidity, such as a glass epoxy resin, carbon-fiber-reinforced resin, a zirconium oxide ceramic material or titanium. Since the finer the component fibers of a glass cloth, the higher is the strength of the glass cloth, the strength of the glass cloth can be adjusted by selectively determining the fineness of the component glass fibers. A zirconium ceramic material is a desirable material.

More concretely, the frame 114 of a glass epoxy resin may be formed of a glass epoxy resin of 1600 kgf/mm$^2$ in elastic modulus and 13 kgf/mm$^2$ in bending breaking strength (JIS K6911).

The frame 114 of a glass epoxy resin is combined with the substrate 111 by, for example, the following method.

First, a thermosetting bonding film of an epoxy resin or the like is bonded temporarily to a glass epoxy substrate of a predetermined thickness (0.5 mm) equal to the height of the frame 114.

Subsequently, the glass epoxy substrate carrying the thermosetting bonding film temporarily bonded thereto is fastened to a glass epoxy substrate of a thickness greater than the height (0.5 mm) of the frame 114 with a double-coated adhesive tape.

Then, the glass epoxy substrate is held on both sides and fastened with pins or the like using a paper phenol plate, and the glass epoxy substrate is machined in the shape of the frame 114 by a router. A portion of the glass epoxy substrate corresponding to a space defined by the frame 114 is removed first by machining, and then portions of the same around the frame 14 are machined.

The frame 114 thus formed is positioned in place on the substrate 111, and the frame 14 and the substrate 11 are heated at 160° C. for 15 min under a pressure of 240 kgf for thermal bonding to fix the frame 114 to the substrate 111.

The frame 114 may be made of a thermosetting resin or a UV-setting resin by potting or silk printing.

The widths a and b of the sections of the peripheral isolation region 115c of the IC module 110 were determined taking into consideration the results of endurance tests shown in Table 1, but values of the widths a and b are not limited to those shown in Table 1.

In the endurance tests, a test cycle of a bend test method specified in ISO Standard 7816-1 was repeated several times, and the bending durability of test IC cards was evaluated from failures in the IC modules 110 of the IC cards. The bend test method specified in ISO Standard 7816-1 repeats 250 bending cycles at a rate of 30 bending cycles per minute in a maximum deflection of 20 mm for a longer edge face bend test and a longer side reverse bend test, and a maximum deflection of 10 mm for a shorter edge face bend test and a shorter edge reverse bend test. Thus, the test IC cards are bent 250×4=1000 times. This standard test is repeated 1000 times for ten sets.

TABLE 1

| Width a of longer | Number of failures in IC module Width b of shorter sections (mm) | | |
|---|---|---|---|
| sections (mm) | 0.2 | 0.3 | 0.4 |
| 0.2 | 3 | 3 | 2 |
| 0.3 | 2 | 2 | 2 |
| 0.4 | 1 | 1 | 0 |
| 0.5 | 0 | 0 | 0 |

TABLE 1-continued

| Width a of longer sections (mm) | Number of failures in IC module Width b of shorter sections (mm) | | |
|---|---|---|---|
| | 0.2 | 0.3 | 0.4 |
| 0.6 | 0 | 0 | 0 |
| 1.0 | 0 | 0 | 0 |

It is known from Table 1 that the IC card is able to withstand the bend endurance test conforming to ISO Standard 7916-1 when the width a of the longer sections of the peripheral isolation region is 0.5 mm or above.

In this embodiment, the width of the isolation grooves 115b formed in the contact layer 115 to isolate the contacts 115a from each other is 0.2 mm which is approximately equal to the width of the isolation grooves of ordinary IC modules. The widths a and b of the sections of the peripheral region 115c are greater than the width of the isolation grooves 115b.

Figure 10A:
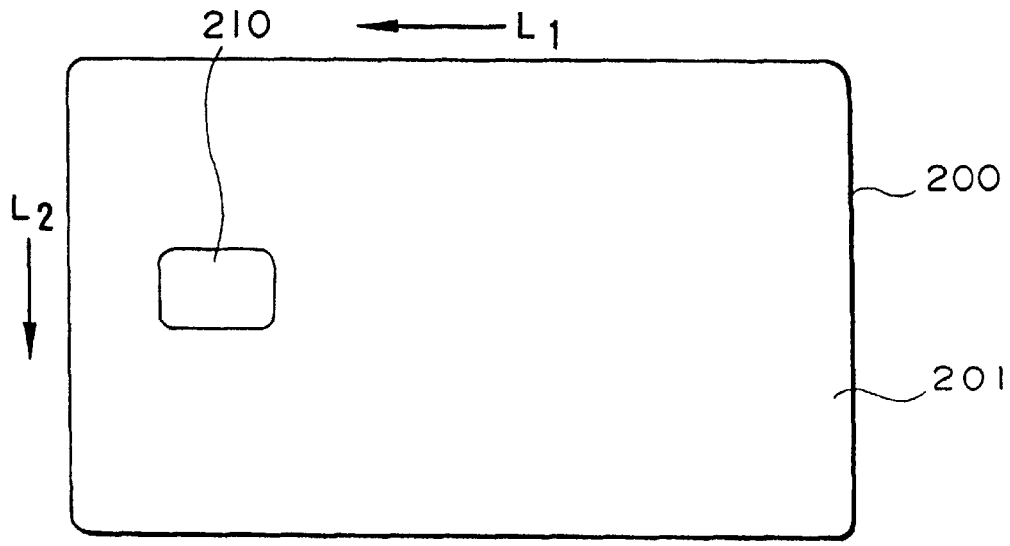
FIG. 10A is a plan view of an IC card in a modified embodiment according to the present invention.

A modification of the third embodiment will be described with reference to FIGS. 10A to 10C. FIG. 10A is a plan view of an IC card, FIG. 10B is a plan view of an IC module, and FIG. 10C is a sectional side view of the IC module of FIG. 10B.

Figure 10B:
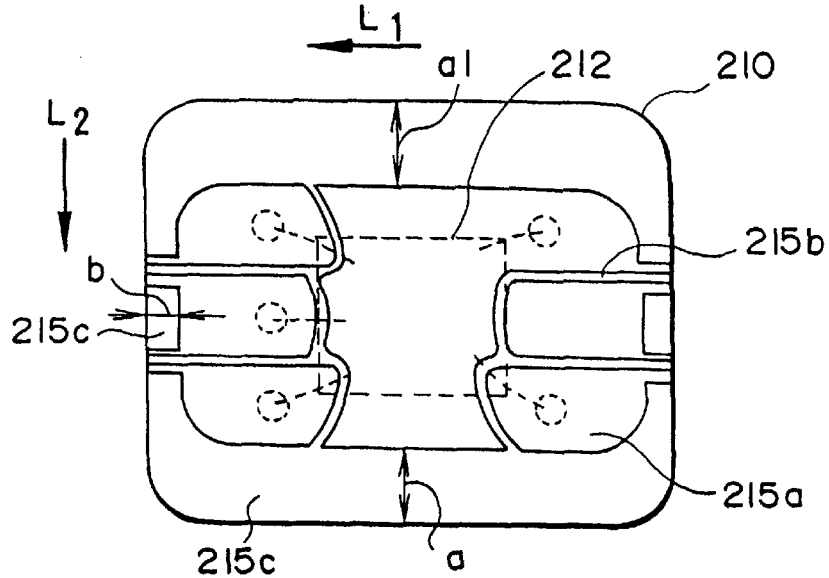
FIG. 10B is a plan view of an IC module included in the IC card of FIG. 10A.
Figure 10C:
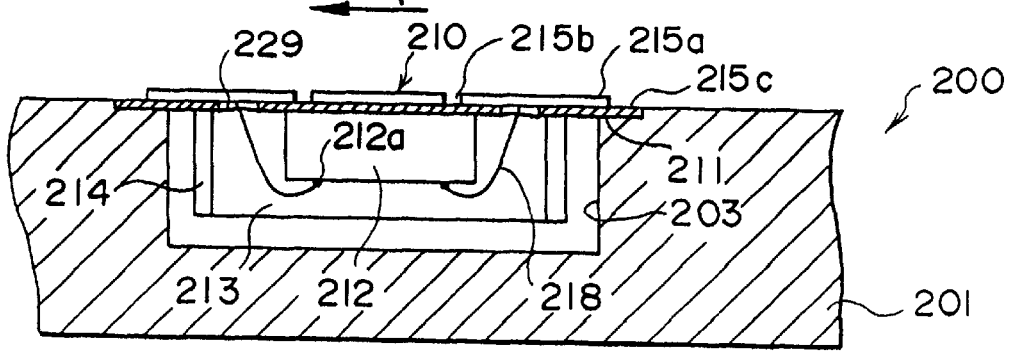
FIG. 10C is a typical sectional side view of the IC card of FIG. 10A.

Referring to FIGS. 10A to 10C, an IC card 200 has a base card 201, and an IC module 210 placed in a cavity 203 formed in the base card 201. The IC module 210 comprises a substrate 211, contacts 215a formed by dividing a contact layer 215 by isolation grooves 215b, an IC chip 212, and wires 218 connecting electrode pads 212a included in the IC chip 212 to the contacts 215a of the contact layer 215 and extending through gaps 229 formed in the substrate 211.

A frame 214 is attached to the substrate 211 and a space defined by the frame 214 is filled up with an encapsulating resin 213 so as to encapsulate the IC chip 212.

In the IC module 210 shown in FIGS. 10A to 10C, the wires 218 are extended across the isolation grooves 215b. In FIGS. 10A to 10C, the longer sections, i.e., the sections extending along the longer edges of the base card 201 of the peripheral isolation region 215c have a width a of 0.6 mm and the shorter sections extending along the shorter edges of the base card 201 of the peripheral isolation region 215c have a width b of 0.3 mm. In FIG. 10B, the IC chip 210 and the wires 218 are indicated by dotted lines to facilitate understanding the positional relation between the components.

The IC module 210 is provided with the frame 214 for reinforcing the encapsulating resin 213. The substrate 211 and the encapsulating resin 213 are formed of the same materials as those of the substrate 111 and the encapsulating resin 113 of the IC module 110 shown in FIGS. 9A to 9C, respectively, so that the IC chip 212 and the encapsulating resin 213 are difficult to crack.

IC modules of the same construction as that of the IC module 210 shown in FIGS. 10A to 10C were subjected to endurance tests for different values of the widths a and b of the sections of the peripheral isolation region 215c according to an endurance test method specified in ISO Standard 7816-1. Test results were substantially the same as those for the IC module 110 shown in FIGS. 9A to 9C, and no failure occurred in the IC module 210 when the width a of the longer sections of the peripheral isolation region 215c was 0.5 mm or above.

The IC cards 100 and 200 embodying the present invention were applied to practical use. The number of physical failures in the IC modules due to the bending of the IC cards 100 and 200 was smaller than that of physical failures in conventional IC cards, Particularly, cracks in the IC chips 112 and 212 were reduced significantly in practical use.

Even when the IC cards 100 and 200 were bent to an extent in which permanent deformation of the IC cards 100 and 200 is possible, no physical failure occurred in the IC modules 110 and 210.

The IC modules 110 and 210 can be made to flex more satisfactorily than the conventional IC modules when the IC cards 100 and 200 are bent by forming the substrates 111 and 211 of the IC modules 110 and 210 of a material more flexible than that of the base cards 101 and 201, and forming the sections of the peripheral isolation regions 115c and 215c in relatively big widths a and b to narrow the contact layers 115 and 215. Consequently, physical failures in the IC modules 110 and 210 attributable to the bending of the IC cards 100 and 200 can be reduced, and the possibility of development of cracks in the IC chips 112 and 212 and that of breakage of the encapsulating resin 113 and 213 can be reduced remarkably.

Fourth Embodiment

Figure 12:
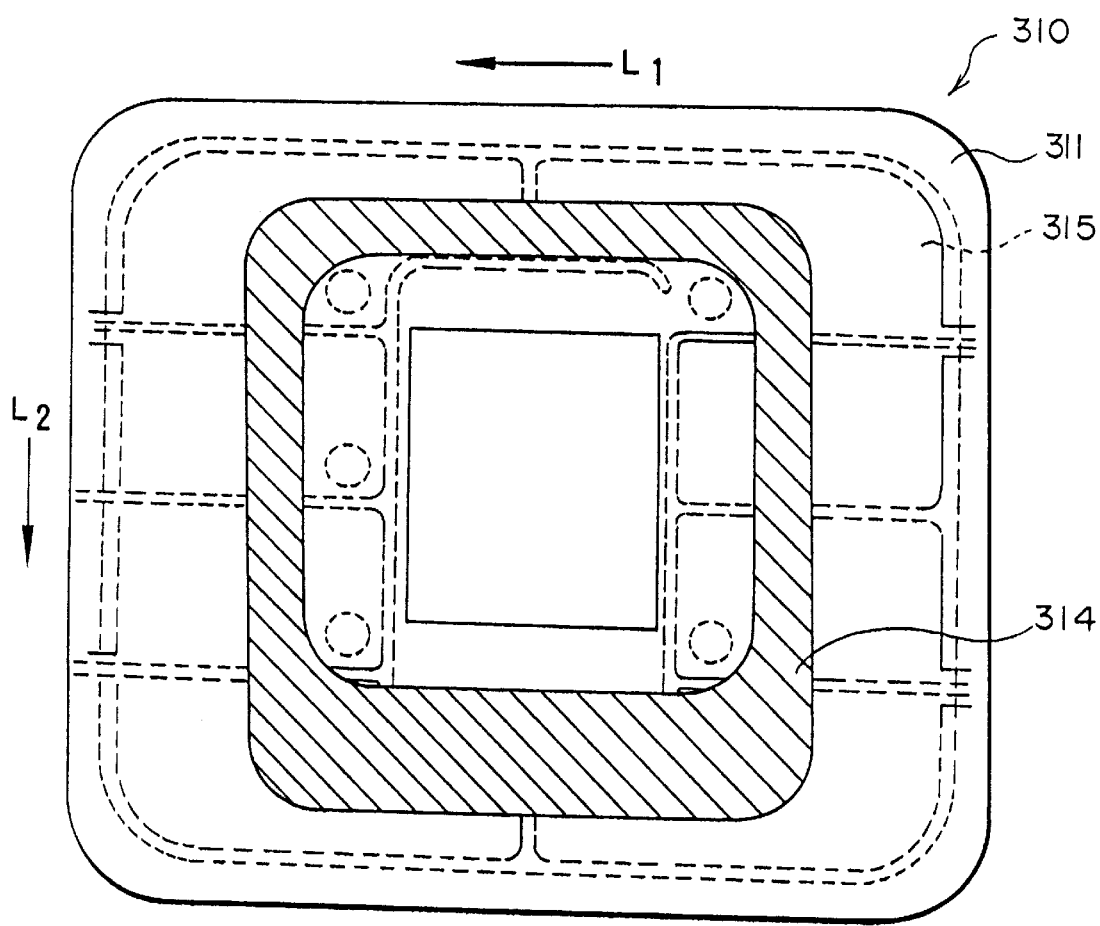
FIG. 12 is a plan view of an IC module in a fourth embodiment according to the present invention.

An IC card in a fourth embodiment according to the present invention will be described with reference to FIGS. 12 to 15C. An IC card in the fourth embodiment is similar in construction as the IC card 1 shown in FIGS. 1A and 1B and employs an IC module 310 as shown in FIG. 12 instead of the IC module 1 of the IC card 1. The IC module 310 is placed in a cavity 3 formed in a base card 2.

As shown in FIG. 12, the IC module 310 comprises a substrate 311, a contact layer 315 formed on one surface of the substrate 311, and an IC chip 313 attached to the other surface of the substrate 311. A frame 314 is attached to the other surface of the substrate 311 so as to surround the IC chip 312 and a space defined by the frame 314 is filled up with an encapsulating resin 13 (FIG. 1B). The space defined by the frame 314 need not necessarily be filled up with the encapsulating resin 13.

As shown in FIG. 12, the frame 314 has a rectangular shape in plan view, The width of a section of the frame 314 parallel to a direction L1 in which the longer edges of a base card 2 extend is greater than those of the other three sections to enhance the rigidity of the frame 314 against a force resulting from the longer edge bending of the base card 2.

It is essential to form the frame 314 of a material having mechanical strengths including elastic modulus and breaking strength, and rigidity higher than those of the encapsulating resin 13 (FIG. 1B). Although most part of the mechanical strength of the encapsulating resin 13 is secured by a solid filler contained in the encapsulating resin 13, it is difficult to increase the mechanical strength of the encapsulating resin 13 by increasing the filler content of the encapsulating resin 13 without any restriction because of restrictions on the filler content in view of facility in handling the encapsulating resin 13 when filling up the space defined by the frame 314. Practically, the upper limits of the elastic modulus and the bending breaking strength of the encapsulating resin 13 are 3000 kgf/mm$^2$ and 20 kgf/mm$^2$, respectively. Therefore, the frame 314 is made of a material having mechanical strengths exceeding the upper limits of the mechanical strengths of the encapsulating resin 13 for reinforcement.

According to the present invention, the highly strong frame 314 is formed by machining a carbon-fiber-reinforced plate of 64000 kgf/mm$^2$ in elastic modulus and 113 kgf/mm$^2$ in bending breaking strength in an annular shape by a router. A carbon-fiber-reinforced plate or a glass epoxy plate formed by impregnating a glass cloth with an epoxy resin is a suitable material for forming the frame 314 in respect of strength and strength of adhesion to the encapsulating resin 13. Since the finer the component fibers of a glass cloth, the higher is the strength of the glass cloth, it is desirable to use a glass cloth of fine glass fibers for forming a glass epoxy plate.

Figure 13:
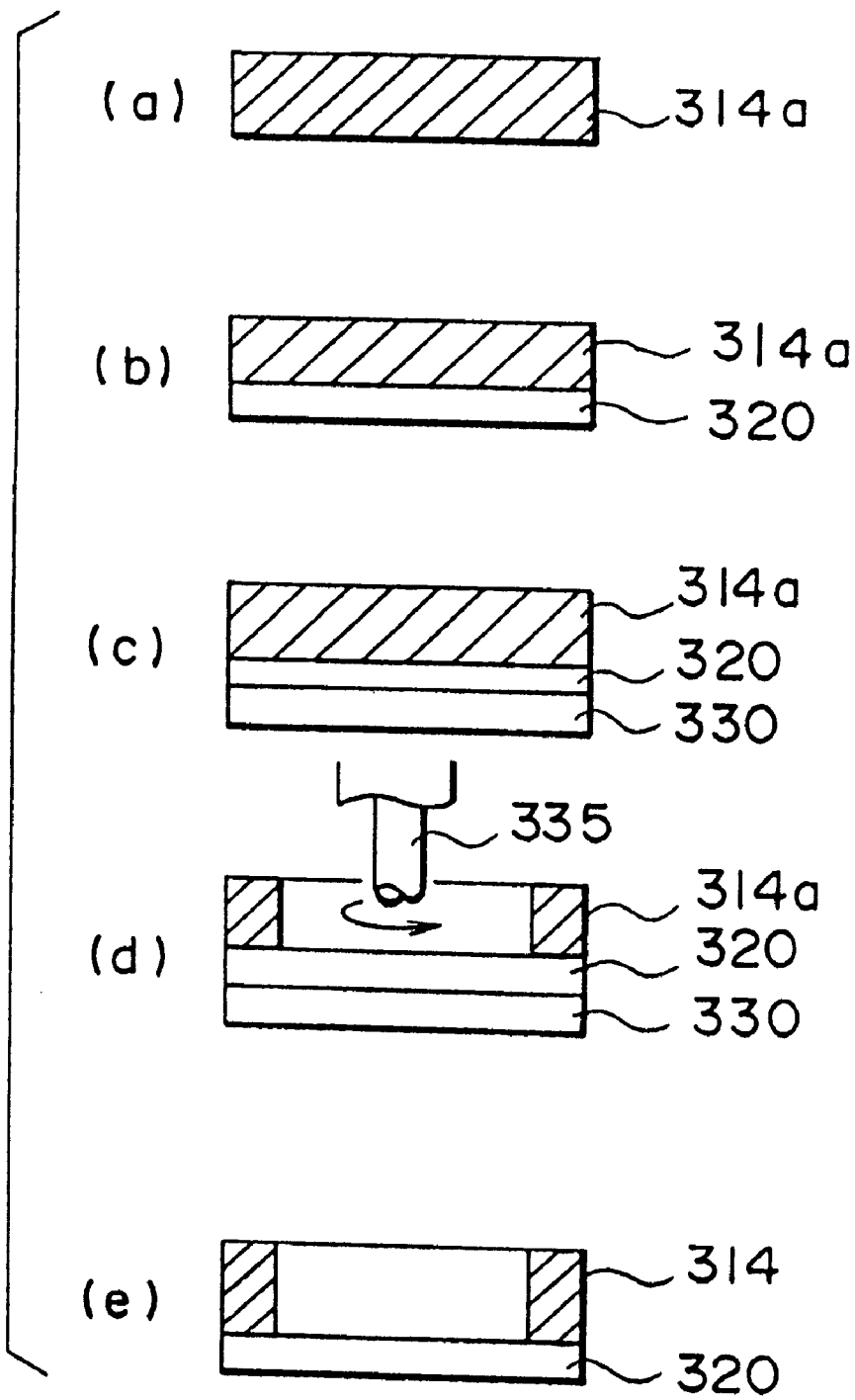
FIG. 13 is a view to assist in explaining steps of a process of forming a frame included in the IC module of FIG. 12.

A method of forming the frame 314 will be concretely described with reference to FIG. 13. When forming the frame 314 in a height of 0.4 mm, four 0.1 mm thick prepregs were laminated to obtain a sheet 314a having a large reinforcement content and a high mechanical strength. Then, a bonding sheet 320 was attached temporarily to one side of the sheet 314a. Although hot-melt bonding sheets of a thermosetting epoxy resin or a thermoplastic polyester resin are used generally, the former sheets require a long bonding time and the latter sheets are inferior in heat resistance. Therefore, a sheet consisting of a thermosetting component and a thermoplastic component, and having the well harmonized characteristics of both the thermosetting sheet and the thermoplastic sheet was used as the bonding sheet 320. After temporarily attaching the bonding sheet 320 to the sheet 314a by a roll laminator, the bonding sheet 320 was backed with a 100 μm thick plastic film 330, and then the sheet 314a was machined in a predetermined annular shape by a router 335. Subsequently, the plastic film 330 was removed from the bonding sheet 320 to complete the frame 314. The frame 314 is bonded to the substrate 311 with the bonding sheet 320.

The frame 314 may be formed by injection-molding a glass-fiber-reinforced, high-strength plastic material, such as a PPS (polyphenylene sulfide) or a liquid crystal polyester instead of routing the sheet 314a by a router. Although a frame formed by injection molding compares favorably in strength with the frame 314 formed by routing the sheet 314a, the strength of adhesion to the encapsulating resin n13 is low and hence the encapsulating resin 13 is liable to be separated from the frame 314. The separation of the encapsulating resin 13 from the frame 314 can be prevented by forming the inner surface of the frame 314 in a tapered shape. Frames of zirconium oxide and titanium have a high strength. A frame of a carbon-fiber-reinforced resin can be formed by a molding process instead of a routing process. The use of a molding process for forming a frame is advantageous for mass-producing frames.

Figure 14A:
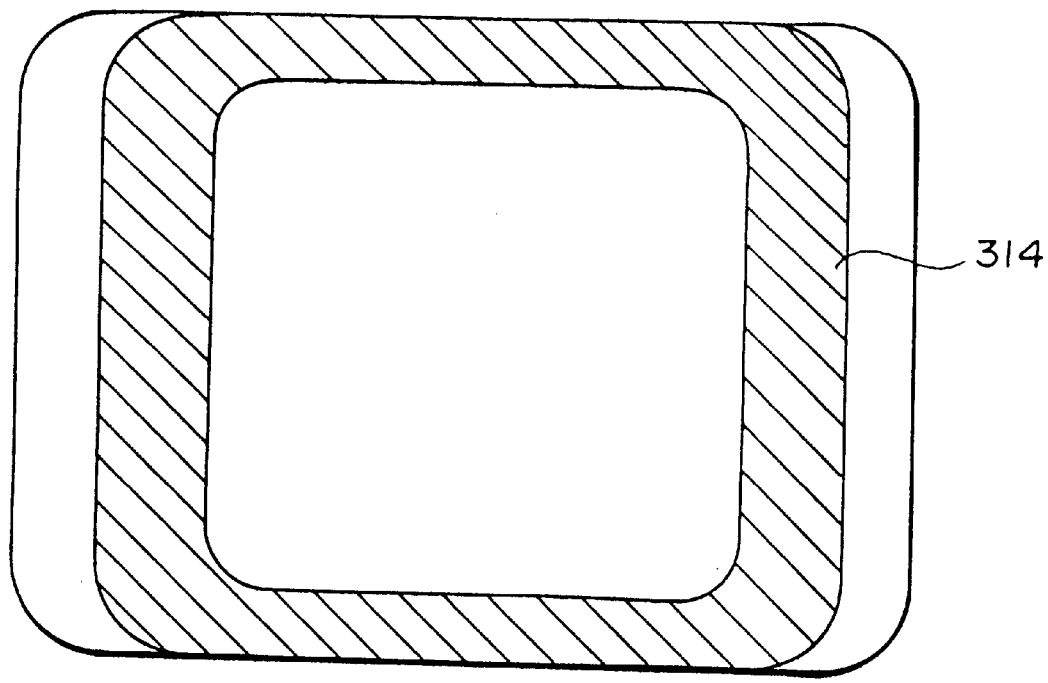
FIG. 14A is a plan view of a frame in a modification.
Figure 14B:
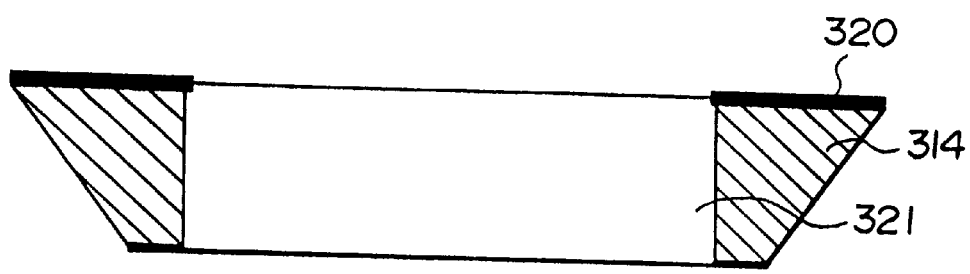
FIG. 14B is a sectional side view of the frame of FIG. 14A.

Modifications of the frame 314 will be described with reference to FIGS. 14A to 15C. Referring to FIGS. 14A and 14B, an adhesive sheet 320 is attached to a surface of a frame 314 on the side of the substrate 311, and the frame 314 defines a space 321 therein. The inner surface of the frame 314 is perpendicular to the substrate 311 and the adhesive sheet 310, while the outer surface of the same is tapered in a direction away from the substrate 311, i.e., downward as viewed in FIG. 14B.

Since the surface of the frame 314 to be attached to the substrate 311 has a relatively large area, the effect of reinforcement with respect to the shape of the IC chip and directions in which the card is bent can optionally be adjusted.

Figure 15A:
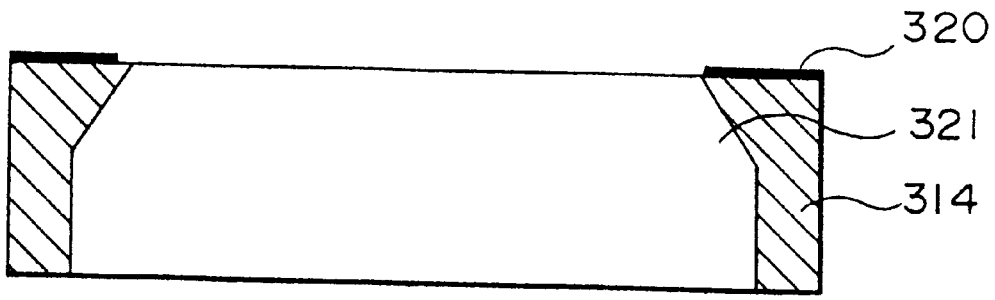
FIG. 15A is a sectional side view of a frame in another modification.

A frame 314 shown in FIG. 15A has an outer surface perpendicular to the substrate 311, and an inner surface having a half section tapered so that the area of a space 321 defined by the inner surface increases in a direction away from the substrate 311, i.e., downward as viewed in FIG. 15A, and another half section perpendicular to the substrate 311.

Figure 15B:
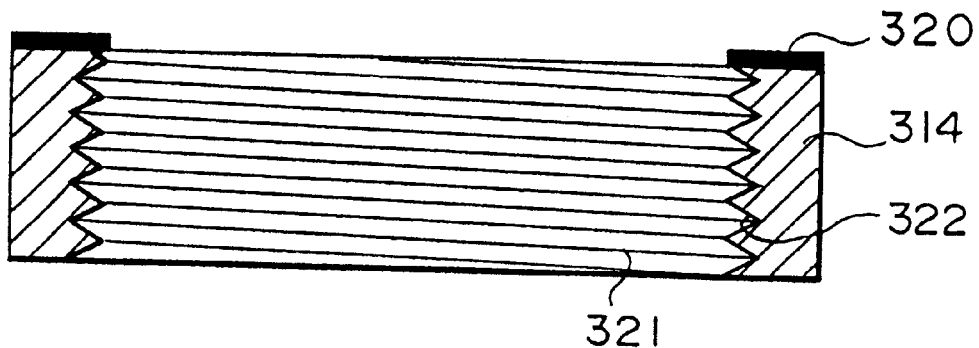
FIG. 15B is a sectional side view of a frame in a further modification.

A frame 314 shown in FIG. 15B has n inner surface provided with circular ridges 322. The circular ridges 322 prevent the separation of the encapsulating resin 13 from the frame 314.

Figure 15C:
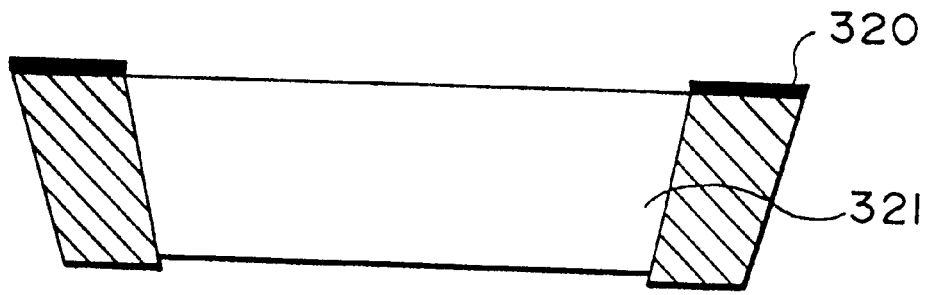
FIG. 15C is a sectional side view of a frame in still a further modification.

A frame 314 shown in FIG. 15C has a tapered outer surface and a tapered inner surface tapered in a direction away from the substrate 311, i.e., downward as viewed in FIG. 15C. The tapered inner surface prevents the separation of the encapsulating resin 13 from the frame 314.

What is claimed is:

1. An IC card comprising:

an IC module comprising a rectangular substrate, a rectangular contact layer formed on an opposed surface of the substrate, an IC chip mounted on another surface of the substrate, and a frame attached to the another surface of the substrate so that the frame and substrate in combination completely surround the IC chip; and a base card holding the IC module;

wherein the contact layer is formed in a shape smaller than that of the substrate to form an outer isolation region in which a portion of the surface of the substrate is exposed, the contact layer is divided into a plurality of sections by inner isolation regions, and sections of the outer isolation regions have a width greater than that of the inner isolation regions, and the sections of the outer isolation regions consist of a first pair of sections parallel to each other and a second pair of sections parallel to each other, the first pair of sections having a width greater than that of the second pair of sections.

2. The IC card according to claim 1, wherein sections of the outer isolation region extending in parallel to shorter edges of the base card have a width in the range of 0.2 to 28.02 mm.

3. The IC card according to claim 1, wherein sections of the outer isolation region extending in parallel to longer edges of the base card have a width in the range of 0.2 to 65.85 mm.

4. The IC card according to claim 1, wherein the IC chip is connected to a circuit provided on the other surface of the substrate by wires, and the wires are extended in regions corresponding to the sections of the contact layer separated by the inner isolation regions.

5. An IC module comprising:

a rectangular substrate;

a rectangular contact layer formed on an opposed surface of the substrate;

an IC chip mounted on another surface of the substrate; and a frame attached to the another surface of the substrate so that the frame and substrate in combination completely surround the IC chip;

wherein the contact layer is formed in a shape smaller than that of the substrate to form an outer isolation region in which a portion of the surface of the substrate is exposed, the contact layer is divided into a plurality of sections by inner isolation regions, and sections of the outer isolation regions have a width greater than that of the inner isolation regions, and the sections of the outer isolation regions consist of a first pair of sections parallel to each other and a second pair of sections parallel to each other, the first pair of sections having a width greater than that of the second pair of sections.

6. The IC module according to claim 5, wherein
sections of the outer isolation region extending in parallel to shorter edges of a base card have a width in the range of 0.2 to 28.02 mm.

7. The IC module according to claim 5, wherein
sections of the outer isolation region extending in parallel to longer edges of a base card have a width in the range of 0.2 to 65.85 mm.

8. The IC module according to claim 5, wherein
the IC chip is connected to a circuit provided on the other surface of the substrate by wires, and the wires are extended in regions corresponding to the sections of the contact layer separated by the inner isolation regions.

* * * * *